United States Patent
Bayless et al.

(10) Patent No.: US 11,784,092 B2
(45) Date of Patent: Oct. 10, 2023

(54) DISPOSING PROTECTIVE COVER FILM AND UNDERFILL LAYER OVER SINGULATED INTEGRATED CIRCUIT DICE FOR PROTECTION DURING INTEGRATED CIRCUIT PROCESSING

(71) Applicant: Micron Technology, Inc., Boise, ID (US)

(72) Inventors: Andrew M. Bayless, Boise, ID (US); Brandon P. Wirz, Taichung (TW)

(73) Assignee: Micron Technology, Inc., Boise, ID (US)

(*) Notice: Subject to any disclaimer, the term of this patent is extended or adjusted under 35 U.S.C. 154(b) by 9 days.

(21) Appl. No.: 16/994,941

(22) Filed: Aug. 17, 2020

(65) Prior Publication Data

US 2021/0272846 A1    Sep. 2, 2021

Related U.S. Application Data

(60) Provisional application No. 63/018,261, filed on Apr. 30, 2020, provisional application No. 62/982,587, filed on Feb. 27, 2020.

(51) Int. Cl.
| | | |
|---|---|---|
| *H01L 21/78* | (2006.01) | |
| *H01L 21/56* | (2006.01) | |
| *H01L 21/268* | (2006.01) | |
| *H01L 21/683* | (2006.01) | |
| *H01L 21/02* | (2006.01) | |

(52) U.S. Cl.
CPC ........ *H01L 21/78* (2013.01); *H01L 21/02076* (2013.01); *H01L 21/268* (2013.01); *H01L 21/561* (2013.01); *H01L 21/6836* (2013.01)

(58) Field of Classification Search
CPC .............. H01L 21/304; H01L 21/6836; H01L 21/78–786
See application file for complete search history.

(56) References Cited

U.S. PATENT DOCUMENTS

| | | | |
|---|---|---|---|
| 8,883,615 B1 | 11/2014 | Holden | |
| 9,093,518 B1* | 7/2015 | Lei | ............. H01L 24/92 |
| 9,495,631 B1* | 11/2016 | Koepp | ............. G06K 19/07752 |
| 9,502,272 B2 | 11/2016 | Chen | |
| 2002/0105092 A1* | 8/2002 | Coyle | ..................... H01L 21/56 |
| | | | 257/778 |
| 2002/0180041 A1* | 12/2002 | Sahara | ............... H01L 23/3114 |
| | | | 257/738 |

(Continued)

*Primary Examiner* — Brian Turner
(74) *Attorney, Agent, or Firm* — Lowenstein Sandler LLP

(57) ABSTRACT

Singulated integrated circuit (IC) dice are provided. The singulated IC dice are positioned on dicing tape to provide open space between sides of adjacent singulated IC dice. An underfill layer and a protective cover film is disposed above the singulated IC dice and the open space between the sides of the adjacent singulated IC dice. The underfill layer and the protective cover film include one or more photodefinable materials. An exposure operation is performed to produce a pattern on the underfill layer and the protective cover film. Based on the pattern, the underfill layer and the protective cover film is removed at areas above the open space between the sides of the adjacent singulated IC dice to create portions of the underfill layer and portions of the protective cover film that are disposed above the singulated IC dice.

9 Claims, 17 Drawing Sheets

(56) References Cited

U.S. PATENT DOCUMENTS

| | | | |
|---|---|---|---|
| 2003/0045031 A1* | 3/2003 | Kobayashi | B23K 26/142 |
| | | | 257/E21.599 |
| 2003/0190795 A1* | 10/2003 | Kawakami | H01L 24/97 |
| | | | 257/E21.599 |
| 2004/0203188 A1* | 10/2004 | Draney | H01L 24/29 |
| | | | 438/106 |
| 2008/0318396 A1* | 12/2008 | Shin | H01L 21/78 |
| | | | 257/E21.211 |
| 2009/0004780 A1* | 1/2009 | Arita | H01L 24/743 |
| | | | 438/114 |
| 2013/0309792 A1* | 11/2013 | Tischler | H01L 33/0093 |
| | | | 438/28 |
| 2016/0276307 A1* | 9/2016 | Lin | H01L 23/562 |
| 2018/0158691 A1* | 6/2018 | Yokoi | H01L 21/6836 |
| 2018/0174908 A1* | 6/2018 | Karasaki | H01L 21/30655 |
| 2018/0240726 A1* | 8/2018 | Suthiwongsunthorn | H01L 23/544 |
| 2019/0267287 A1* | 8/2019 | Hariharan | H01L 23/562 |
| 2020/0135564 A1* | 4/2020 | Zundel | H01L 21/049 |

* cited by examiner

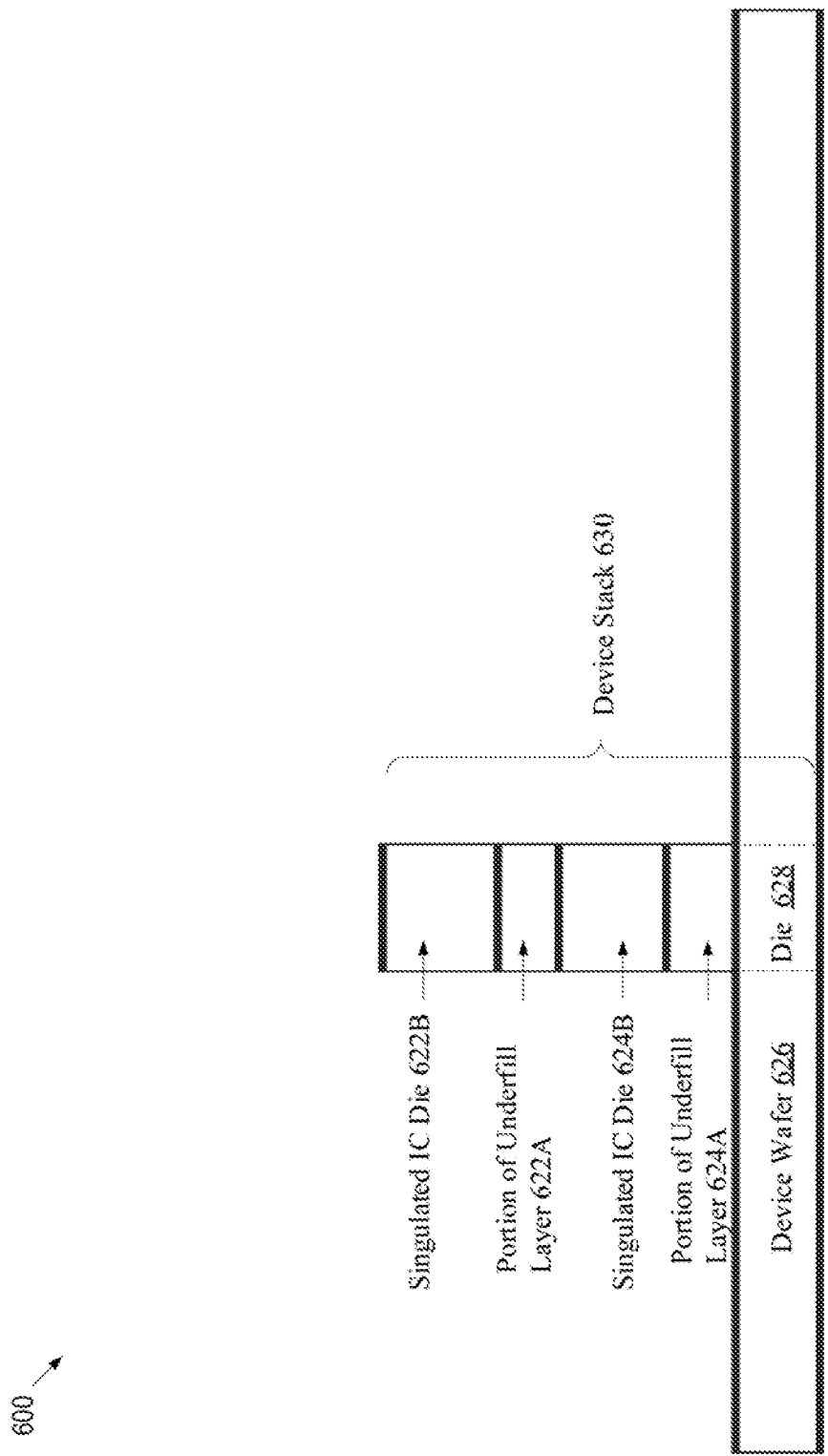

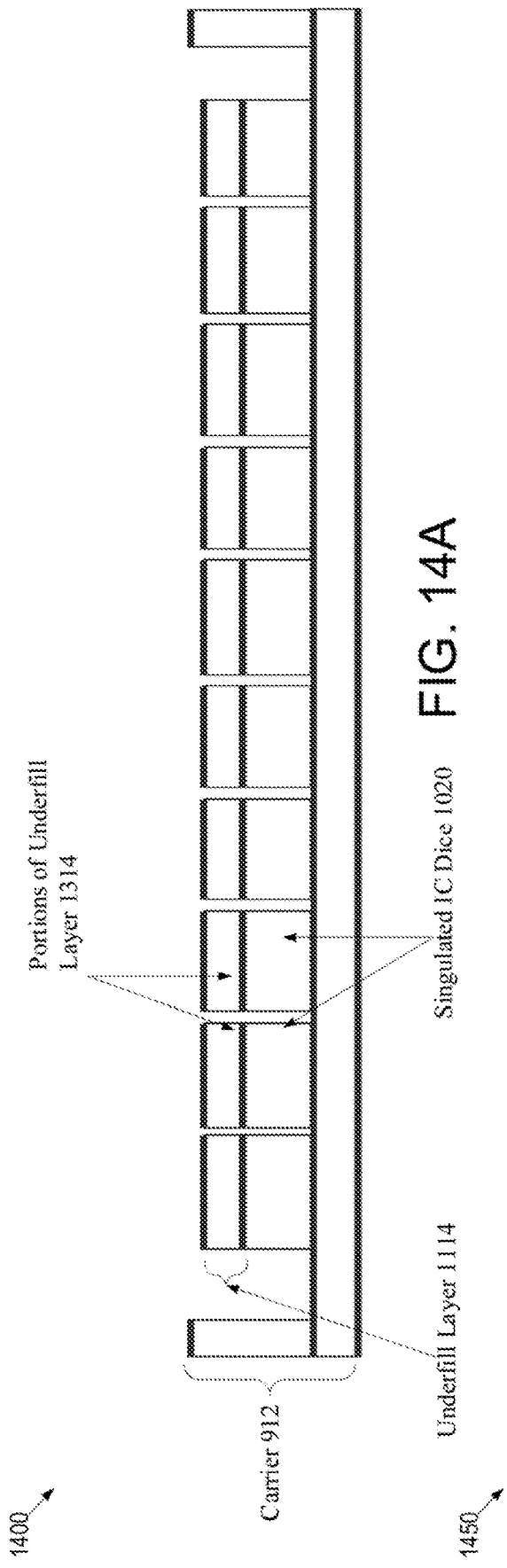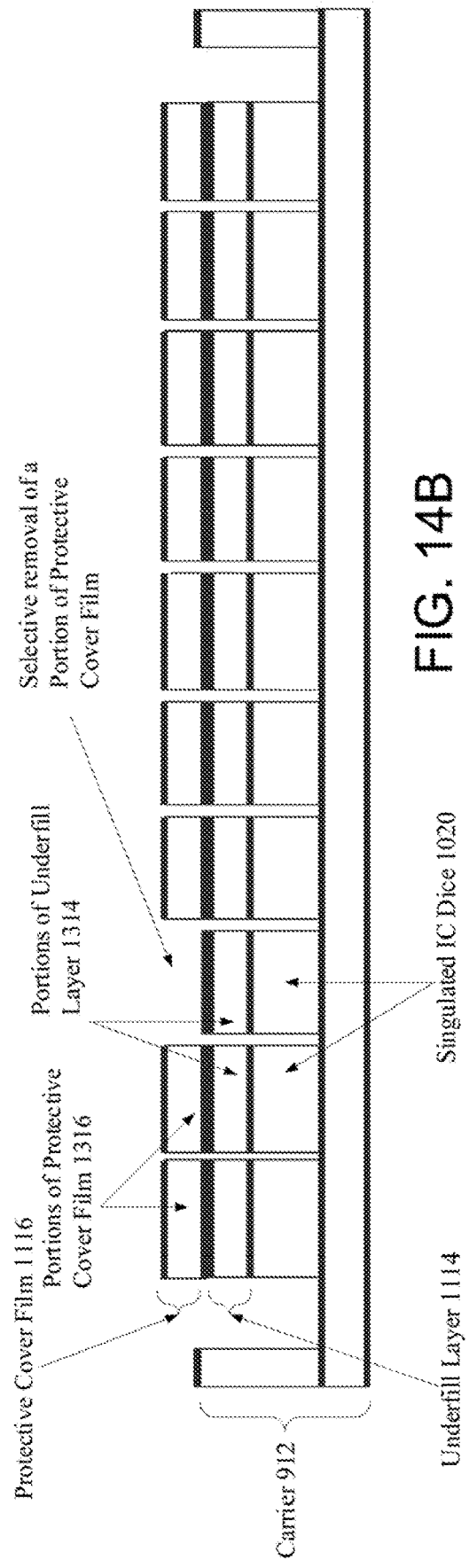

DISPOSING PROTECTIVE COVER FILM AND UNDERFILL LAYER OVER SINGULATED INTEGRATED CIRCUIT DICE FOR PROTECTION DURING INTEGRATED CIRCUIT PROCESSING

RELATED APPLICATIONS

This application claims benefit of U.S. Provisional Application No. 62/982,587, filed Feb. 27, 2020 and U.S. Provisional Application No. 63/018,261, filed Apr. 30, 2020, the contents of which are incorporated by reference herein.

TECHNICAL FIELD

Embodiments of the disclosure relate generally to semiconductor fabrication, and more specifically, relate to using a protective cover film for underfill protection during integrated circuit processing.

BACKGROUND

Integrated circuit (IC) die stacking can include a process of mounting multiple die above one another where the stacked die are eventually packaged in a single semiconductor package to form a discrete electrical device. The adoption of stacked IC die continues to increase in an effort to reduce the overall electrical device footprint and to improve the electrical performance of the electrical device.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 6 illustrates a device stack in a fabrication process including seventh operations that stack multiple die above one another, in accordance with some embodiments of the disclosure.

FIG. 14A illustrates singulated IC dice of a device wafer used in a fabrication process including sixth operations for removing one or more portions of the protective cover film, in accordance with some embodiments of the disclosure.

FIG. 14B illustrates singulated IC dice of a device wafer used in a fabrication process including seventh operations for removing one or more portions of the protective cover film, in accordance with some embodiments of the disclosure.

DETAILED DESCRIPTION

Figure 1:
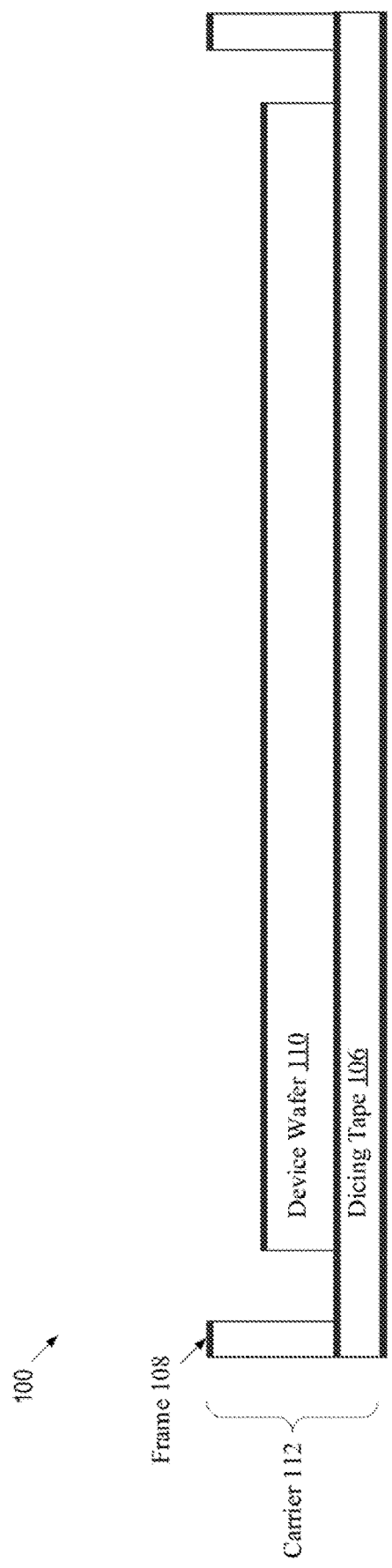
FIG. 1 illustrates a device wafer used in a fabrication process including first operations for providing a device wafer on a carrier, in accordance with some embodiments of the disclosure.

Die stacking includes fabricating one or more wafers with IC dice. The wafers can be placed on a carrier and diced to form singulated IC dice. The singulated IC dice are picked and sorted to find functional "good" die and to remove non-functional "bad" die. A functional singulated IC die can have an underfill layer above a surface of the singulated IC die. The underfill layer can include a dielectric material. When two functional IC dice are stacked to form a stacked device, the underfill layer can be sandwiched between the two stacked dice. The underfill layer can help electrically insulate the two stacked dice as well as aid in the soldering and bonding of the stacked IC dice.

In some conventional fabrication systems, a wafer-level underfill can be applied to a wafer. When the wafer is diced to form singulated IC dice, contaminates from the dicing operation can fall onto the underfill layer. Additionally, in some instances, when a singulated IC die is picked from the carrier, additional contaminants can fall on to the underfill layer of singulated IC die that are still positioned on the carrier. The contaminants on the underfill layer can cause the singulated IC dice and the resultant stacked devices to have electrical and mechanical defects, which can contribute to low yields.

Aspects of the disclosure address the above and other deficiencies by disposing an underfill layer and a protective cover film above the device wafer. The protective cover film can be positioned above the underfill layer. During dicing of the device wafer, the protective cover film can be left on the device wafer and protect the underlying underfill layer from contaminants.

In some embodiments, the underfill layer above singulated IC dice can be selectively removed prior to removing the singulated IC dice from the carrier. One or more of the remaining singulated IC dice that are on the carrier can keep their respective portions of the protective cover film. When the selected singulated IC die is remove from the carrier, the protective cover film on the singulated IC dice that are on the device wafer can help protect the singulated IC dice (and the underfill layer) on the carrier from contamination.

In some embodiments, the protective cover film can be a material that adheres to the top surface of the underfill layer using an adhesive bond. For instance, the protective cover film can be a polymer that is coupled to underfill layer using an adhesive. The protective cover film can have an adhesive strength that is less than the adhesive strength between the underfill layer and device wafer, and an adhesive strength that is less than the adhesive strength between the bottom surface of a singulated IC die and the dicing tape of the carrier, such that when the protective cover film is removed the underfill layer remains on the singulated IC die and the singulated IC die remains adhered to the carrier.

In an illustrative embodiment, the underfill layer can include a non-conductive film (NCF). The NCF can include a solid material, such as a polymer, that is dispensed as a solid sheet. In some instances, both the protective cover film and the NCF are pre-adhered and dispensed as a single sheet. The sheet that includes both the protective cover film and the NCF can be laminated above the wafer using a one or more of heat or pressure. When the device wafer is diced, the protective cover film and NCF remain on the device wafer and the resultant singulated IC dice. With respect to the singulated IC dice, the protective cover film can be removed (e.g., peeled) from the underlying NCF using a force that is greater than the adhesive bond between the protective cover film and NCF at any desired time during the fabrication process.

Further aspects of the disclosure address the above and other deficiencies by separating IC dice of a device wafer into singulated IC dice. In some embodiments, loose particles associated with separating the IC dice from the device wafer can be removed using the clean operation. The singulated IC dice are provided on dicing tape of a carrier. The singulated IC dice are positioned on the dicing tape to provide open space (e.g., streets) between the sides of the adjacent singulated IC dice. An underfill layer and protective cover film are disposed above the singulated IC dice and the open space between the sides of the adjacent singulated IC dice. One or more of the underfill layer or protective cover film include a photodefinable material. An exposure operation is performed to produce a pattern on the underfill layer and the protective cover film. Based on the pattern, the underfill layer and the protective cover film are removed at areas above the open space between the sides of the adjacent singulated IC dice to create portions of the underfill layer and portions of the protective cover film that are disposed above the singulated IC dice. Since the device wafer is diced and cleaned prior to the disposition of the underfill layer, the underfill layer is exposed to fewer contaminants. Also, singulated (e.g., portions) of protective cover film over the portions of underfill layer can further protect the underfill layer from contaminants generated during IC processing.

Advantages of the disclosure include, but are not limited to, improved IC die yield and improved stacked device yield in view of other IC processing techniques. In particular, aspects of the disclosure reduce contaminants on the underfill layer during the integrated circuit fabrication process, which can result in improved yield.

It can be noted that the following FIGS. 1-6 and FIGS. 9-13B are described as an apparatus (e.g., device wafer) and a series of operations for purposes of illustration, rather than limitation. It can be noted that some, all, more, or different operations can be performed in some embodiments. It can be noted that in some embodiments, some of the operations can be performed in a different order or not at all.

FIG. 1 illustrates a device wafer used in a fabrication process including first operations for providing a device wafer on a carrier, in accordance with some embodiments of the disclosure.

Diagram 100 of FIG. 1 illustrates a device wafer 110 orientated above a carrier 112 (also referred to as a "wafer carrier," herein). In some embodiments, a device wafer 110 can refer to a patterned wafer that has been patterned with electrical circuits during a fabrication process, such as a semiconductor fabrication process. Device wafer 110 can have multiple integrated circuits (ICs) that have been fabricated on the device wafer 110. The integrated circuits can be separated (e.g., diced) from the device wafer 110 to form multiple singulated IC dice. In some embodiments, carrier 112 can refer to a platform that supports a device wafer 110. For example, the carrier 112 can be used to help handle the device wafer 110 or to transport the device wafer 110 from one piece of fabrication equipment to another piece of fabrication equipment. In another example, carrier 112 can be used to help store the associated device wafer 110. In an illustrative example, the carrier 112 can include a frame 108 (also referred to as a "wafer frame ring" herein) and dicing tape 106. Frame 108 can be formed from a rigid material such a metal or metal alloy. Dicing tape 106 can be a material that holds the device wafer 110 and can be used to hold the device wafer 110 and resultant singulated IC dice during a dicing operation to separate individual IC die from the device wafer 110. An adhesive on the top side of the dicing tape can hold the device wafer 110 (or singulated die) in place. Dicing tape 106 can be made of many materials such as polyolefin, polyethylene or polyvinyl chloride (PVC), for example.

Figure 2:
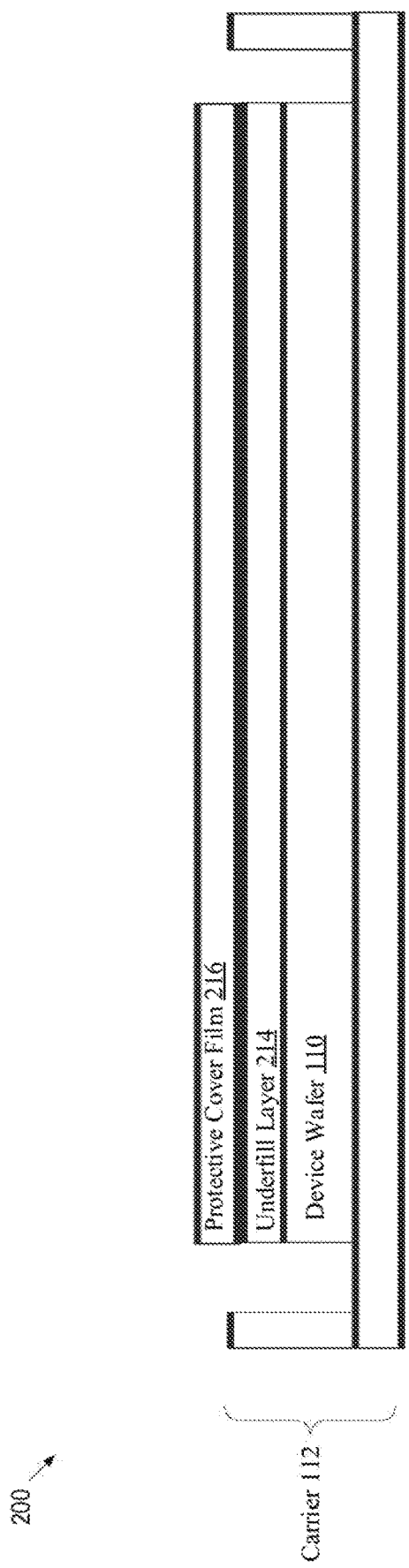
FIG. 2 illustrates a device wafer used in a fabrication process including second operations for forming and underfill layer and a protective cover film above the device wafer, in accordance with some embodiments of the disclosure.

FIG. 2 illustrates a device wafer used in a fabrication process including second operations for forming and underfill layer and a protective cover film above the device wafer, in accordance with some embodiments of the disclosure.

Diagram 200 of FIG. 2 shows underfill layer 214 (also referred to as "wafer-level underfill" herein) and protective cover film 216 formed above device wafer 110. Underfill layer 214 can refer to an electrically-insulating material (e.g., dielectric material) that is applied to a device wafer 110 or singulated die. In some embodiments, the underfill layer 214 can be an adhesive layer that has an adhesive strength and adheres to the device wafer 110. In some embodiments, the underfill layer 214 can be fully or partially cured after being disposed on the device wafer 110 using one or more of heat or pressure. In some embodiments, the underfill layer 214 can fully or partially encapsulate any electrical contacts (e.g., pillars) of the underlying IC dice on which the underfill layer is disposed. In some embodiments, the underfill layer 214 can help compensate for the thermal expansion mismatch between the first IC die and another IC die (or substrate) to which the first IC die is bonded.

In some embodiments, the underfill layer 214 (and protective cover film 216) can be fully or partially transparent such that an optical detection device can detect the areas between the IC dice of the device wafer 110 (e.g., for dicing) or detect the electrical connections of the IC die that are used for die to die (or substrate) bonding. For example, the alignment features can be formed at the device wafer 110. The alignment features can be positioned in "streets" that are areas between the IC dice of the device wafer 110. A charged coupled device (CCD) or optical camera can be used to detect the alignment features under the underfill layer 214 (and protective cover film 216). The device wafer 110 can be diced using the alignment features as guides such the IC dice of the device wafer 110 can be separated without damaging the IC dice.

In some embodiments, the underfill layer 214 includes a non-conductive film (NCF). The NCF can include an electrical insulating material (e.g., dielectric). The NCF can include a cleaning agent that facilitates soldering by removing oxidation. The NCF can also protect from the solder being reflowed to adjacent electric contacts and cause electrical damage (e.g., electrical shorting). In some embodiments and as noted above, the NCF is a solid material that can be dispensed as a solid sheet of material. For example, the sheet of NCF can be unrolled from a roll and placed on top of the underlying device wafer 110. In some embodiments, the NCF and the protective cover film 216 can be dispensed as a single sheet of material, as discussed above and further below. The NCF can have one or more characteristics as discussed with respect to underfill layer 214. In other embodiments, the underfill layer 214 can be or include different materials such as, but not limited to thermosetting polymers (e.g., epoxies), silica, or other material In some embodiments, a protective cover film 216 can be a layer that adheres to the top surface of the underfill layer 214 using an adhesive bond. For example, the protective cover film 216 can include an adhesive that adheres to the top surface of the underfill layer 214. The protective cover film 216 can have an adhesive strength that is less than the adhesive strength between the underfill layer 214 and device wafer 110. The protective cover film 216 can have an adhesive strength that is less than the adhesive strength between the device wafer 110 (or singulated IC die) and the dicing tape 106 of the carrier 112. The low adhesive strength allows the protective cover film 216 (or portions of the protective cover film 216) to be removed (e.g., pulled off) without removing the underlying underfill layer 214 or singulated IC die from the carrier 112. In some embodiments, the protective cover film 216 can also be fully or partially transparent, which allows an optical detection device to detect areas between the dice of the device wafer 110. In some embodiments, the underfill layer 214 can be "tacky" or have adhesive characteristics such that the protective cover film 216 can adhere to the top surface of the underfill layer 214 without using an additional adhesive material. In some embodiments, the protective cover film 216 can be a solid material that is dispensed as a solid sheet. In some embodiments, the electrical contacts that extend from the IC dice of the device wafer 110 extend through the underfill layer 214 but do not extend through the protective cover film 216. The protective cover film 216 can include a material that is different from the underfill layer 214. In some embodiments, the protective cover film 216 does not include a resist material (e.g., a material that cures or hardens responsive to exposure to a light source, such as ultraviolet light).

In some embodiments, the underfill layer 214 and the protective cover film 216 can be applied together using a single operation, such as a lamination operation. In some embodiments, the underfill layer 214 and protective cover film 216 are pre-adhered to one another (e.g., single sheet) prior to applying the underfill layer 214 and protective cover film 216 to the device wafer 110. A solid sheet that includes both the underfill layer 214 and protective cover film 216 are placed above the device wafer 110 and laminated to the device wafer 110 using a lamination operation. The lamination operation applies both heat and pressure that causes the underfill layer 214 to adhere to the top surface of the device wafer 110. For example, a heated platen can be positioned above the sheet of underfill layer 214 and protective cover film 216. The heated platen can apply both heat and pressure to the sheet. In another example, a bladder can be used to apply pressure around the device wafer 110, underfill layer 214, and protective cover film 216 by using a vacuum. Heat can be applied in the vacuum to perform the lamination operation.

In some embodiments, the underfill layer 214 and the protective cover film 216 can be applied using multiple operations. For example, the underfill layer 214 can be applied to the top surface of the device wafer 110. The protective cover film 216 can be applied to the top surface of the underfill layer. For example, a capillary underfill operation dispenses underfill material (as a liquid) on the device wafer 110. Capillary action is relied on to draw the underfill material over the device wafer 110. The underfill material can be cured at an elevated temperature before or after the application of the protective cover film 216. In some embodiments, after the underfill material is dispensed, the protective cover film 216 can be dispensed as sheet as described herein. In other embodiments, after the underfill material is dispensed the protective cover film 216 can be disposed as a liquid layer (e.g., spin coated).

In another example where the underfill layer 214 and the protective cover film 216 are applied using multiple operations, the underfill layer 214 can be dispensed as a liquid towards the center of the device wafer 110 and distributed across the device wafer 110 and accelerate the wafer to a determined radial velocity (e.g., spin coating). The underfill layer 214 can be partially cured (e.g., b-staged). The protective cover film 216 can be applied above the underfill layer 214 either as a sheet or liquid, as described herein.

Figure 3:
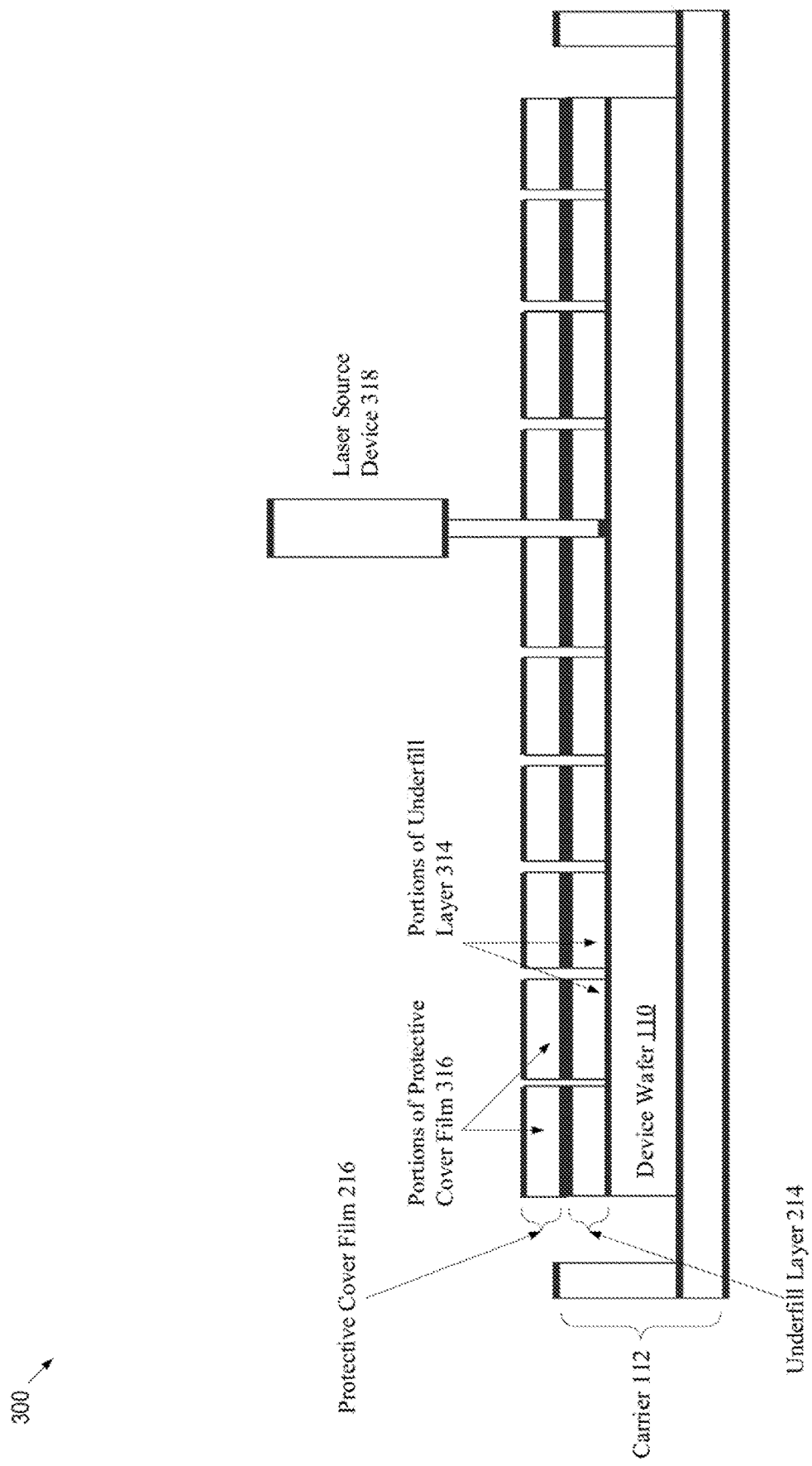
FIG. 3 illustrates a device wafer used in a fabrication process including third operations for removing the underfill layer and the protective cover film above an area of the device wafer that is between the IC dice of the device wafer, in accordance with some embodiments of the disclosure.

FIG. 3 illustrates a device wafer used in a fabrication process including third operations for removing the underfill layer and the protective cover film above an area of the device wafer that is between the IC dice of the device wafer, in accordance with some embodiments of the disclosure.

Diagram 300 of FIG. 3 shows the removal of the underfill layer 214 and protective cover film 216 above an area of the device wafer 110 that is between the IC dice of the device wafer 110 (e.g., above the streets of the device wafer 110). The underfill layer 214 and protective cover film 216 are removed above the streets of the device wafer 110 to create multiple portions of the protective cover film 316 and multiple portions of the underfill layer 314. It can be noted that after the removal of the protective cover film 216 and underfill layer 214 above the streets of the device wafer 110 that the underfill layer 214 and the protective cover film 216 are effectively singulated to form portions of protective cover film 316 and portions of protective cover film 316.

In some embodiments, laser source device 318 can be used to remove the underfill layer 214 and protective cover film 216 above the streets of the device wafer 110. For example, the laser source device 318 can emit a light of a selected wavelength (and selected power) that etches the protective cover film 216 and underfill layer 214 at the desired areas. In some embodiments, the laser source device 318 can remove the protective cover film 216 and the underfill layer 214 in the desired area without dicing the underlying IC dice of the device wafer 110. For example, the wavelength of light and power can be selected such that the laser source device 318 etches the protective cover film 216 and the underfill layer 214 without etching the device wafer 110. In other embodiments, the protective cover film 216 and underfill layer 214 can be removed using different techniques, such as a physical saw or chemical material removal, for example.

Figure 4:
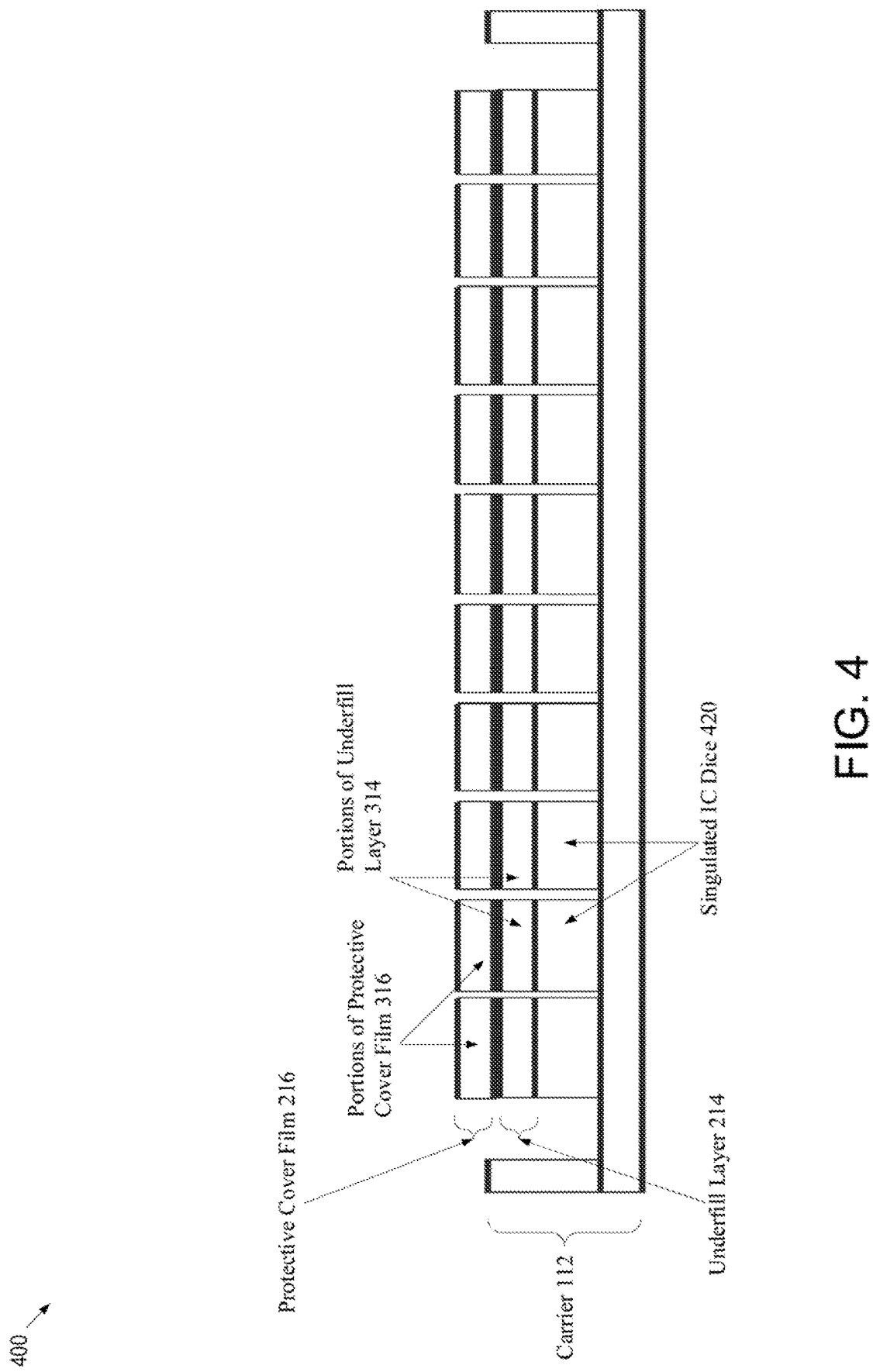
FIG. 4 illustrates a device wafer used in a fabrication process including fourth operations for dicing the IC dice from the device wafer to form singulated IC dice, in accordance with some embodiments of the disclosure.

FIG. 4 illustrates a device wafer used in a fabrication process including fourth operations for dicing the IC dice from the device wafer to form singulated IC dice, in accordance with some embodiments of the disclosure.

Diagram 400 of FIG. 4 shows the dicing of the device wafer 110 to form singulated IC dice 420. In some embodiments, a laser source device, such as laser source device 318 of FIG. 3, can be used to dice the individual IC die of the device wafer 110. In some embodiments, the same laser source device can be used to separate the protective cover film 216, the underfill layer 214 and the device wafer 110. For example, laser source device 318 can use a first wavelength of light and first selected power to etch the protective cover film 216 and underfill layer 214, and use as second wavelength of light and second selected power to dice the device wafer 110 (e.g., two-pass process). The wavelength of light and the selected power to dice the device wafer 110 can be smaller and higher, respectively, than the wavelength of light and selected power selected to etch the protective cover film 216 and underfill layer 214. In another example, different laser source devices can be used such that the protective cover film 216 and underfill layer 214 are etched using a first laser source device and the device wafer 110 is diced using a different laser source device.

In some embodiment, the device wafer 110 can be diced using different techniques (or a combination thereof) such as a physical saw or chemical material removal or material degradation by light exposure, for example. It can be noted that the removal of the protective cover film 216 and underfill layer 214 and the dicing of the device wafer 110 are described as different operations for the sake of illustration, rather than limitation. In some embodiments, one or more of the protective cover film 216, underfill layer 214 and device wafer 110 can be separated using a single process. For instance, the laser source device 318 can be calibrated with a wavelength of light and selected power to cut through all of the protective cover film 216, underfill layer 214 and device wafer 110 in a single pass.

Figure 5A:
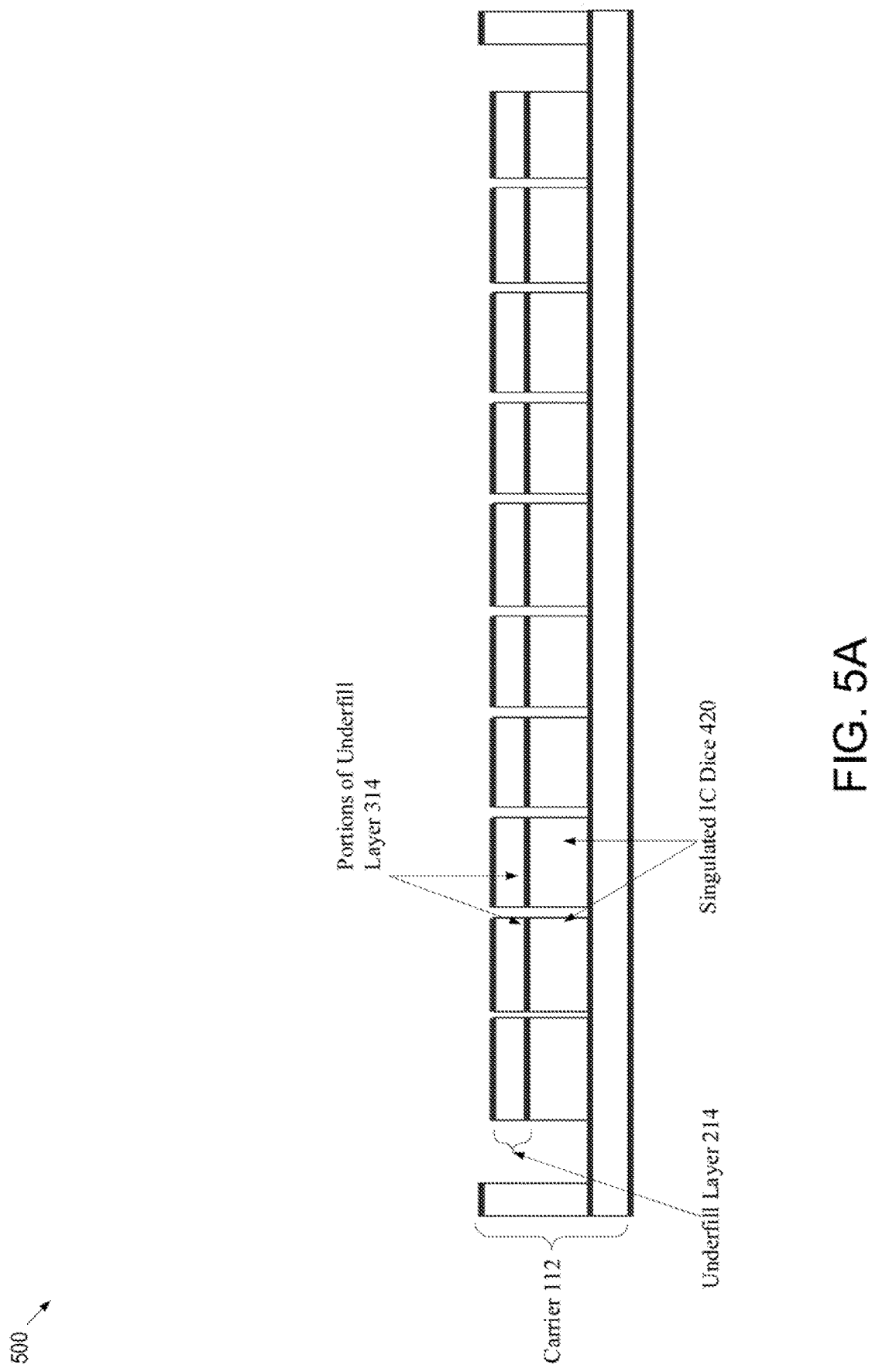
FIG. 5A illustrates a device wafer used in a fabrication process including fifth operations for removing one or more portions of the protective cover film, in accordance with some embodiments of the disclosure.

FIG. 5A illustrates a device wafer used in a fabrication process including fifth operations for removing one or more portions of the protective cover film, in accordance with some embodiments of the disclosure.

Diagram 500 of FIG. 5A shows the removal of all of the portions of protective cover film 316 from the respective portions of underfill layer 314. As noted above, the protective cover film 216 can adhere to the top surface of the underfill layer 214 (e.g., the portions of protective cover film 316 can adhere to respective portions of underfill layer 314 after dicing). In some embodiments, a detaping operation can be performed to remove a portion of protective cover film from a respective portion of underfill layer. For example, the portions of protective cover film 316 can be detaped (e.g., de-laminated) by pulling the portions of protective cover film 316 away from the respective portions of underfill layer 314 with a force greater than the adhesive strength between the portions of protective cover film 316 and portions of underfill layer 314. For instance, the portions of protective cover film 316 can be removed in a manner similar to the removal of adhesive tape from a surface. In some embodiments, all the portions of protective cover film 316 film can be removed during a detaping operation, as illustrated. Subsequent to removing all the portions of protective cover film 316, the singulated IC dice 420 can be removed from carrier 112 and used in subsequent operations, such as die stacking as described with respect to FIG. 6.

Figure 5B:
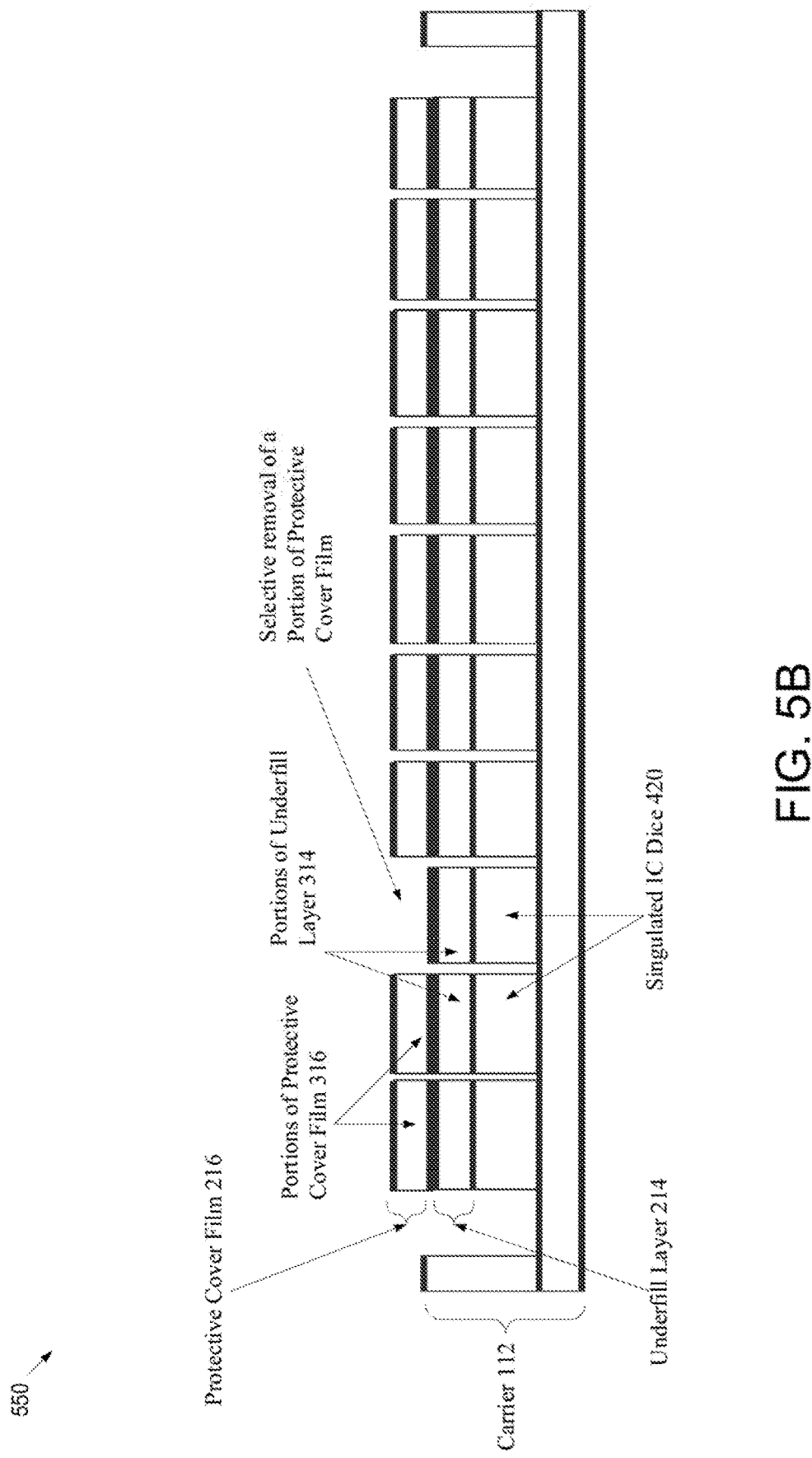
FIG. 5B illustrates a device wafer used in a fabrication process including sixth operations for removing one or more portions of the protective cover film, in accordance with some embodiments of the disclosure.

FIG. 5B illustrates a device wafer used in a fabrication process including sixth operations for removing one or more portions of the protective cover film, in accordance with some embodiments of the disclosure.

Diagram 550 of FIG. 5B shows the selective removal of portions of the protective cover film 216. In some embodiments, one or more singulated dice on the carrier 112 can have respective portions of the protective cover film removed (e.g., selective detaping operation), while other singulated IC dice on the carrier 112 do not have respective portions of the protective cover film removed. In some embodiments, the one or more singulated IC that have had their respective portions of the protective cover film removed can be removed from the carrier 112, while other singulated IC dice having respective portions of the protective cover film 216 remain adhered to the carrier 112. The portions of protective cover film can help protect the respective underlying singulated IC dice (and the respective portions of underfill layer) that remain on the carrier 112 from contaminates (e.g., loose particles associated with the separating the IC dice from the device wafer 110) spread from the removal of the singulated IC die having the respective portion of protective cover film previously removed.

For example, the protective cover film of a first singulated IC die of the singulated IC dice 420 can be removed. The underfill layer of the first singulated IC die can remain. The carrier 112 can include an open area where a second singulated IC die had been previously removed, where the second singulated die was removed prior to removing the protective cover film of the first singulated IC die. A third singulated IC die can also be orientated above the carrier 112. The protective cover film and the underfill layer above the third singulated IC die remains (e.g., when the first or second singulated IC dice are removed from the carrier 112) and protects the third singulated IC die and its portion of underfill layer from the contaminants.

It can be noted that in other embodiments, singulated IC die that include a respective portion of underfill layer and portion of protective cover film can be removed from the carrier 112. The portion of protective cover film of the respective singulated IC die can be removed after the singulated IC die is removed from the carrier 112. For example, the portions of protective cover film can be removed after a singulated IC die is removed from the carrier 112 but before stacking the singulated IC die on another electronic device.

FIG. 6 illustrates a device stack in a fabrication process including seventh operations that stack multiple die above one another, in accordance with some embodiments of the disclosure.

Diagram 600 of FIG. 6 shows a die stacking operation. Device wafer 626 (also referred as a "receiving wafer" herein) can be any type of device wafer. It can be noted that in some embodiments, a singulated IC die can be stacked on a substrate rather than a device wafer 110. Singulated IC die 624B and the respective portion of underfill layer 624A can be removed from the carrier 112 after removal of the respective portion of the protective cover film and placed (tacked) on die 628 of device wafer 626. Another singulated IC die 622B and respective portion of underfill layer 622A can also be removed from the carrier 112 (or different carrier with a different type of IC dice) and tacked above the singulated IC die 624B. Any number of singulated IC die can be stacked in device stack 630.

In some embodiments, a thermal compression bonding (TCB) operation can be performed to bond the stacked die to one another. In a TCB operation, heat and pressure is applied to the device stack 630 (or at least two stacked dice). The TCB operation allows the portion(s) of underfill layer 624A and 622A to fill in any voids and reflow the solder joints to form the interconnects between singulated IC die 622B and 624B.

Elements of FIGS. 1-6 may be described below to help illustrate method 700 and method 800 of FIG. 7 and FIG. 8, respectively. Method 700 and 800 may be performed as one or more operations. It may be noted that method 700 or 800 may be performed in any order and may include the same, different, more, or fewer operations. It may be noted that method 700 or 800 may be performed by one or more pieces of semiconductor fabrication equipment or fabrication tools, herein after referred to as fabrication equipment.

Figure 7:
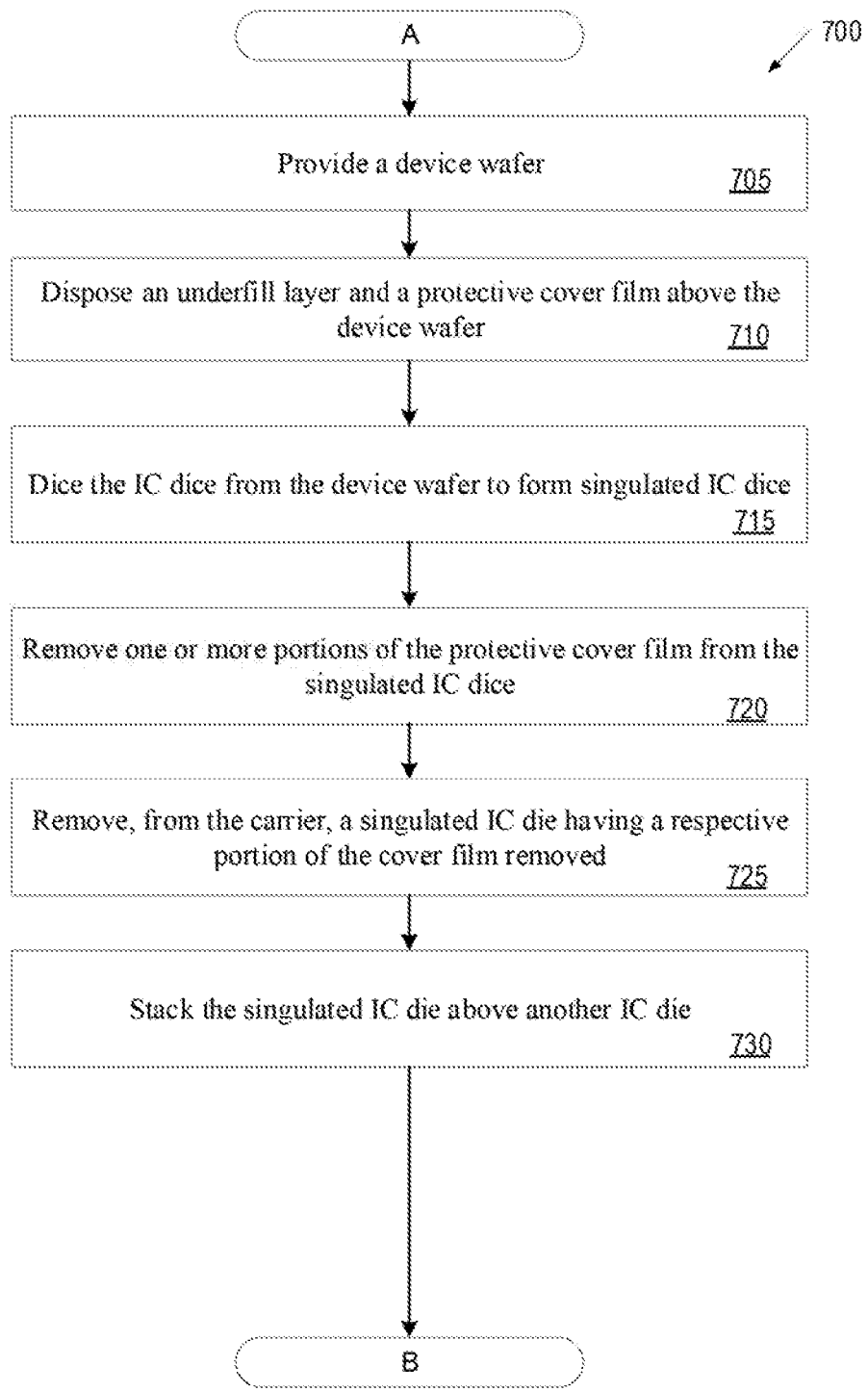
FIG. 7 illustrates a flow diagram of a fabrication process for using a protective cover film for underfill protection, in accordance with some embodiments of the disclosure.

FIG. 7 illustrates a flow diagram of a fabrication process for using a protective cover film for underfill protection, in accordance with some embodiments of the disclosure.

At operation 705 of method 700, fabrication equipment provides a device wafer. The device wafer can include multiple IC dice that are undiced. In some embodiments, the device wafer can be provided on a carrier.

At operation 710, fabrication equipment disposes an underfill layer and a protective cover film above the device wafer. In some embodiments, the protective cover film is above and coupled to the underfill layer. In some embodiments, the underfill layer is an NCF. In some embodiments, the protective cover film and underfill layer are dispensed as a single solid sheet where the protective cover film is pre-adhered to the underfill layer. The sheet can be oriented to cover the underlying device wafer and laminated onto the device wafer. In some embodiments, the underfill layer and protective cover film can be laminated on the device wafer using for example, a lamination operation.

At operation 715, fabrication equipment dices the IC dice from the device wafer to form singulated IC dice. In some embodiments the singulated IC dice include portions of underfill layer and portions of protective cover film laminated above the singulated IC dice.

In some embodiments, dicing the IC dice from the device wafer to form the singulated IC dice includes removing the underfill layer and the protective cover film above an area of the device wafer that is between the IC dice.

In some embodiments, a separate operation is performed where fabrication equipment removes the underfill layer and the protective cover film above an area of the device wafer that is between the IC dice prior to dicing the IC dice form the device wafer to form the singulated IC dice (e.g. two processes).

At operation 720, fabrication equipment removes one or more portions of the protective cover film from the singulated IC dice. In some embodiments, the removal of the one or more portions of the protective cover film exposes respective one or more portions of the underfill layer above the singulated IC dice.

In some embodiments, removing the one or more portions of the protective cover film from the singulated IC dice includes removing the portions the protective cover film using a detaping operation that removes all of the portions of the protective cover.

In some embodiments, removing the one or more portions of the protective cover film from the singulated IC dice includes removing a first portion of the protective cover film above a first singulated IC die. The first singulated IC die is removed from a carrier. The singulated IC dice are orientated above the carrier. Subsequent to removing the first singulated IC die from the carrier, a second portion of the protective cover film above a second singulated IC die is removed.

At operation 725, fabrication equipment removes, from the carrier, a singulated IC die having a respective portion of the protective cover film removed.

At operation, 730, fabrication equipment stacks the singulated die above another IC die. In some embodiments, respective portion of protective cover film of the singulated die has had been previously removed (e.g., operation 725). In some embodiments, the singulated die is stacked above a different object, such as a substrate (e.g., flip chip).

Figure 8:
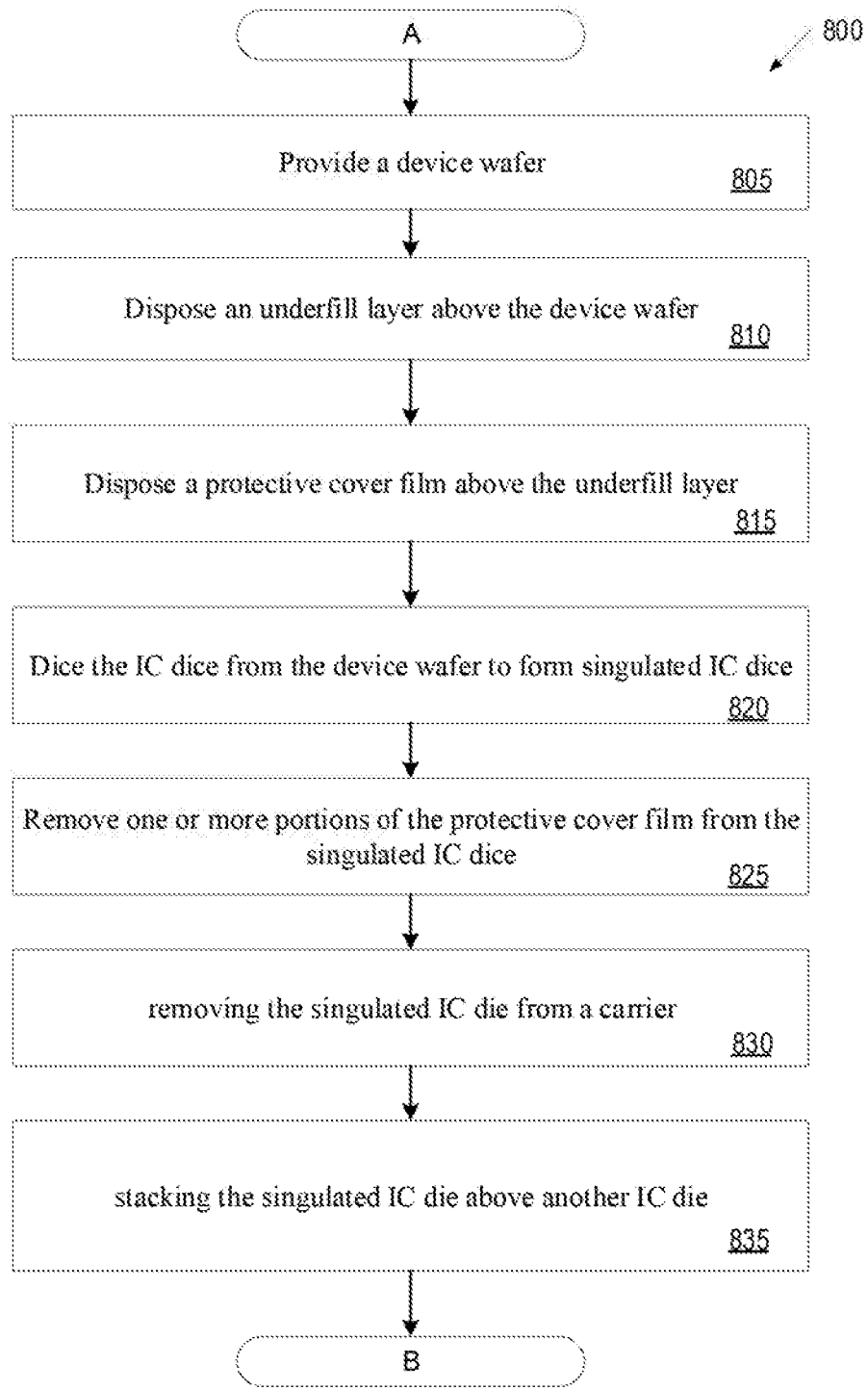
FIG. 8 illustrates a flow diagram of a fabrication process for using a protective cover film for underfill protection, in accordance with some embodiments of the disclosure.

FIG. 8 illustrates a flow diagram of a fabrication process for using a protective cover film for underfill protection, in accordance with some embodiments of the disclosure.

At operation 805 of method 800, fabrication equipment provides a device wafer. The device wafer can include multiple IC dice that are undiced. In some embodiments, the device wafer can be provided on a carrier.

At operation 810, fabrication equipment disposes an underfill layer above the device wafer.

At operation 815, fabrication equipment disposes a protective cover film above the underfill layer.

At operation 820, fabrication equipment dices the IC dice from the device wafer to form singulated IC dice. In some embodiments the singulated IC dice include portions of underfill layer and portions of protective cover film laminated above the singulated IC dice.

In some embodiments, dicing the IC dice from the device wafer to form the singulated IC dice includes removing the underfill layer and the protective cover film above an area of the device wafer that is between the IC dice as part of dicing the IC dice from the device wafer to form the singulated IC dice.

In some embodiments, a separate operation is performed where fabrication equipment removes the underfill layer and the protective cover film above an area of the device wafer that is between the IC dice prior to dicing the IC dice form the device wafer to form the singulated IC dice. In some embodiments, a separation operation is performed where a laser source device is directed to emit light towards the protective cover film and the underfill layer at a location that is above an area of the device wafer that is between the IC dice such that the protective cover film and the underfill layer are separated into portions of the protective cover film and portions of the underfill layer that correspond to respective ones of the IC dice of the device wafer. In some embodiments, the separation operation can be performed prior to dicing the IC dice form the device wafer to form the singulated IC dice.

At operation 825, fabrication equipment removes one or more portions of the protective cover film from the singulated die. The removal of the one or more portions of the protective cover film exposes respective one or more portions of the underfill layer above the singulated IC dice.

In some embodiments, removing the one or more portions of the protective cover film from the singulated IC dice includes removing the portions of the protective cover film using a detaping operation that removes all of the portions of the protective cover film.

In some embodiments, removing the one or more portions of the protective cover film from the singulated IC dice includes removing a first portion of the protective cover film above a first singulated IC die of the singulated IC dice. The first singulated IC die is removed from a carrier where other singulated IC dice are orientated above the carrier. Subsequent to removing the first singulated IC die from the carrier, a second portion of the protective cover film above a second singulated IC die of the singulated IC dice is removed.

At operation 830, fabrication equipment removes the singulated IC die from the carrier 112. The portion of protective cover film of singulated die had been removed prior to removing the singulated IC die from the carrier 112.

At operation 835, fabrication equipment stacks the singulated IC die above another IC die (or other object, such as a substrate).

In some embodiments, a method includes providing a device wafer including integrated circuit (IC) dice; disposing an underfill layer and a protective cover film above the device wafer, wherein the protective cover film is above and coupled to the underfill layer; and dicing, by a processing device, the IC dice from the device wafer to form singulated IC dice, wherein the singulated IC dice include portions of the underfill layer and portions of the protective cover film disposed above the singulated IC dice.

In some embodiments, the method includes removing one or more portions of the protective cover film from the singulated IC dice, wherein the removal of the one or more portions of the protective cover film exposes respective one or more portions of the underfill layer above the singulated IC dice. In some embodiments, the method, wherein removing the one or more portions of the protective cover film from the singulated IC dice includes removing the portions the protective cover film a detaping operation that removes all of the portions of the protective cover film. In some embodiments, the method, wherein removing the one or more portions of the protective cover film from the singulated IC dice includes removing a first portion of the protective cover film above a first singulated IC die; removing the first singulated IC die from a carrier, wherein the singulated IC dice are orientated above the carrier; and subsequent to removing the first singulated IC die from the carrier, removing a second portion of the protective cover film above a second singulated IC die. In some embodiments, the method includes subsequent to removing the first singulated IC die, stacking the first singulated IC die above another IC die.

In some embodiments, the method, wherein dicing the IC dice from the device wafer to form the singulated IC dice includes removing the underfill layer and the protective cover film above an area of the device wafer that is between the IC dice as part of dicing the IC dice from the device wafer to form the singulated IC dice.

In some embodiments, the method includes directing a laser source device to emit light towards the protective cover film and the underfill layer at a location that is above an area of the device wafer that is between the IC dice such that the protective cover film and the underfill layer are separated into portions of the protective cover film and portions of the underfill layer that correspond to respective ones of the IC dice of the device wafer.

In some embodiments, an apparatus includes a carrier; an integrated circuit (IC) dice of a device wafer orientated above the carrier; and a underfill layer above the IC dice; and a protective cover film above the underfill layer, wherein the protective cover film is coupled to the underfill layer using an adhesive bond, wherein the underfill layer and the protective cover film located above an area of the device wafer that is between the IC dice has been removed.

In some embodiments, the underfill layer includes a non-conductive film, and wherein the underfill layer and the protective cover film are laminated to the IC dice. In some embodiments, the protective cover film and underfill layer above the area of the device wafer that is between the IC dice has been removed by emitted light from a laser source device such that the protective cover film and underfill layer are separated into portions of the protective cover film and portions of the underfill layer that correspond to respective one of the IC dice of the device wafer. In some embodiments, the IC dice include singulated IC dice that have been diced from the device wafer, wherein the protective cover film above a first singulated IC die of the singulated IC dice has been removed, and wherein the underfill layer above the first singulated IC die remains. In some embodiments, the carrier includes an open area where a second singulated IC die of the singulated IC dice has been removed from the carrier. In some embodiments, a third singulated IC die of the singulated IC dice is orientated above the carrier, wherein the protective cover film and the underfill layer above the third singulated IC die remains.

In some embodiments, the method includes providing a device wafer including integrated circuit (IC) dice; disposing an underfill layer above the device wafer; disposing a protective cover film above the underfill layer; and dicing, by a processing device, the IC dice from the device wafer to form singulated IC dice, wherein the singulated IC dice include portions of the underfill layer and portions of the protective cover film above the singulated IC dice.

In some embodiments, the method includes removing one or more portions of the protective cover film from the singulated IC dice, wherein the removal of the one or more portions of the protective cover film exposes respective one or more portions of the underfill layer above the singulated IC dice. In some embodiments, wherein removing the one or more portions of the protective cover film from the singulated IC dice includes removing the portions of the protective cover film using a detaping operation that removes all of the portions of the protective cover film. In some embodiments, wherein removing the one or more portions of the protective cover film from the singulated IC dice includes removing a first portion of the protective cover film above a first singulated IC die of the singulated IC dice; removing the first singulated IC die from a carrier, wherein the singulated IC dice are orientated above the carrier; and subsequent to removing the first singulated IC die from the carrier, removing a second portion of the protective cover film above a second singulated IC die of the singulated IC dice. In some embodiments, the method includes subsequent to removing the first singulated IC die, stacking the first singulated IC die above another IC die.

In some embodiments, the method, wherein dicing the IC dice from the device wafer to form the singulated IC dice includes removing the underfill layer and the protective cover film above an area of the device wafer that is between the IC dice as part of dicing the IC dice from the device wafer to form the singulated IC dice. In some embodiments the method includes directing a laser source device to emit light directed towards the protective cover film and the underfill layer at a location that is above an area of the device wafer that is between the IC dice such that the protective cover film and underfill layer are separated into portions of the protective cover film and portions of the underfill layer that correspond to respective ones of the IC dice of the device wafer.

For the sake of clarity, the above description with respect to FIGS. 1-8 are incorporated or apply to the description with respect to FIGS. 9-15 (and vice versa), unless described otherwise. For example, the elements, operations, or embodiments described with respect to FIGS. 1-8 are incorporated or apply to the description of similar elements, operations, or embodiments described with respect to FIGS. 9-15, unless otherwise described. For instance, the description of carrier 112, dicing tape 106, and device wafer 110 respect to FIGS. 1-8 can apply to the description of carrier 912, dicing tape 906, and device wafer 910 with respect to FIGS. 9-5, unless otherwise described. Further for the sake of clarity, the above descriptions with respect to FIGS. 1-8 are generally, but with exceptions, not repeated below with respect to FIGS. 9-15, but can be incorporated in or apply to any aspects described with respect to FIGS. 9-15. It should also be noted that any operations described with respect FIGS. 1-8 can be included in or combined with operations (or methods) described with respect to FIGS. 9-15 (and vice versa).

Figure 9:
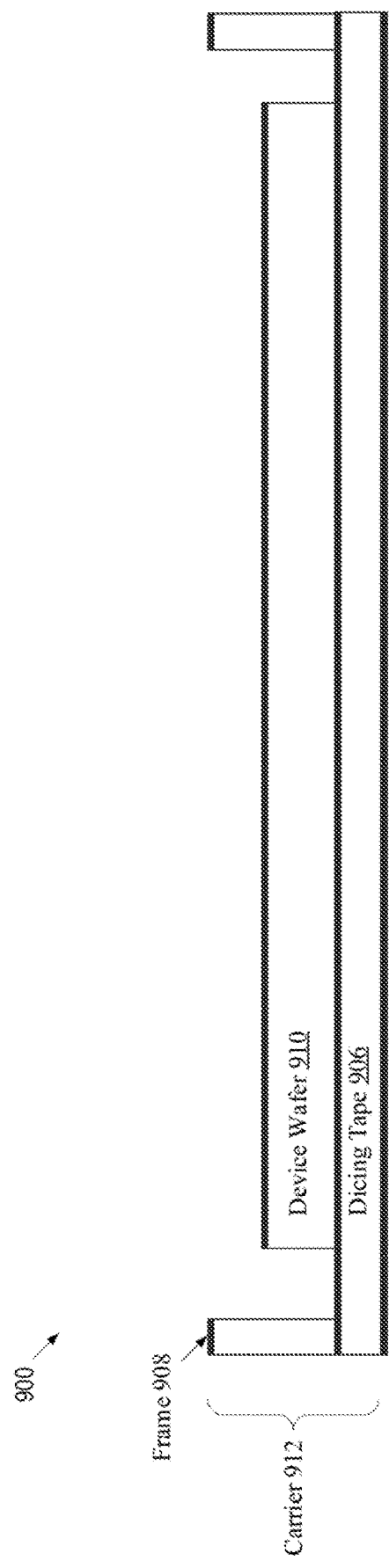
FIG. 9 illustrates a device wafer used in a fabrication process including first operations for providing a device wafer on a carrier, in accordance with some embodiments of the disclosure.

FIG. 9 illustrates a device wafer used in a fabrication process including first operations for providing a device wafer on a carrier, in accordance with some embodiments of the disclosure.

Diagram 900 of FIG. 9 illustrates a device wafer 910 orientated above a carrier 912. The device wafer 910 can include any number of IC dice that have been fabricated on the device wafer 910. The carrier 912 can include one or more of a frame 908 and dicing tape 906. In some embodiments, dicing tape 906 can be transparent or partially transparent. In particular, in some embodiments the dicing tape 906 is transparent or partially transparent to a wavelength of light (or range of wavelengths) used to perform an exposure operation as described further with respect to FIG. 12.

Figure 10:
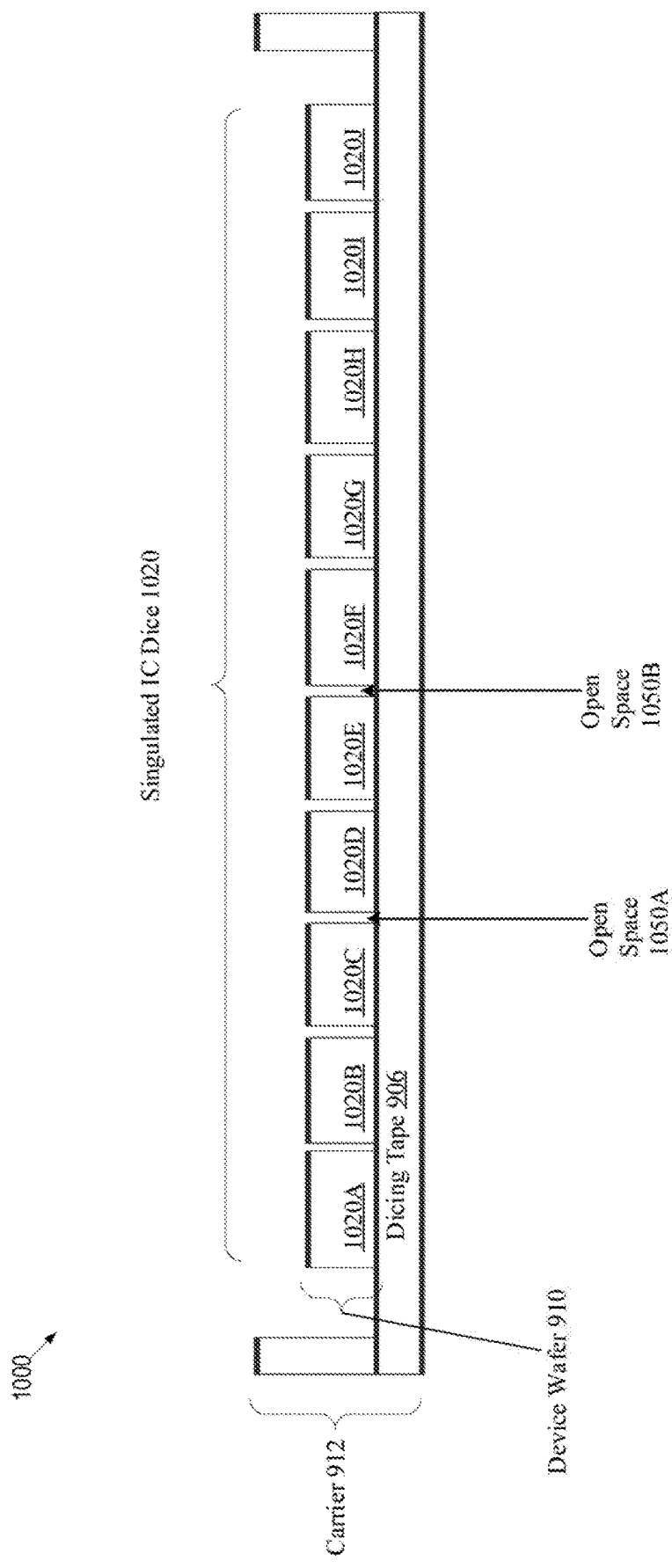
FIG. 10 illustrates singulated IC dice of the device wafer used in a fabrication process including second operations for separating the IC dice from the device wafer, in accordance with some embodiments of the disclosure.

FIG. 10 illustrates singulated IC dice of the device wafer used in a fabrication process including second operations for separating the IC dice from the device wafer, in accordance with some embodiments of the disclosure.

Diagram 1000 of FIG. 10 illustrates singulated IC dice 1020A-1020J (generally referred to as "singulated IC dice 1020" herein). It can be noted that singulated IC dice 1020A-1010J are provided for purposes of illustration, rather than limitation. In some embodiments, any number of singulated IC dice 1020 can be provided.

In some embodiments, the singulated IC dice 1020 are provided on the dicing tape 906 of the carrier 912. The device wafer 110 includes IC dice (e.g., un-singulated as shown in FIG. 9). In some embodiments, the IC dice of the device wafer 910 are separated (e.g., diced) from the device wafer 910 to form singulated IC dice 1020. In some embodiments, a clean operation is performed on the singulated IC dice 1020 to remove any loose particles associated with the separating the IC dice from the device wafer 910. For example, one or more solvents can be used to remove the loose particles from the carrier 912 and singulated IC dice 1020. In some embodiments, any type of cleaning operation can be performed to clean the carrier 912 and singulated IC dice 1020.

In some embodiments, the singulated IC dice 1020 are positioned on the dicing tape 906 to provide open space (e.g., open space 1050A and 1050B, also referred to as "streets" herein) between sides of the adjacent singulated IC dice 1020.

In some embodiments, device wafer 910 is a non-reconstructed wafer, as illustrated in FIG. 9. A non-reconstructed wafer can refer to a semiconductor wafer on which electronic circuits (e.g., multiple IC dice) are directly fabricated. For some embodiments using a non-reconstructed wafer, the carrier 912 is the carrier on which the un-diced device wafer 910 is provided (e.g., a non-reconstructed wafer as shown in FIG. 9), on which the device wafer 910 is separated into singulated IC dice 1020, and on which the underfill layer and protective cover film is disposed. In some embodiments using a non-reconstructed wafer, all the singulated IC dice 1020 are from the same device wafer 910.

In other embodiments, a reconstructed wafer can be used. A reconstructed wafer can refer to a wafer having IC dice that have been diced from a device wafer, that have been removed from the respective carrier on which IC dice were diced, and have been attached (at least some) to a substrate, such as a carrier substrate, or directly on dicing tape of a different carrier. In some instances, the singulated IC dice of a reconstructed wafer can come from one or more device wafers.

Figure 11:
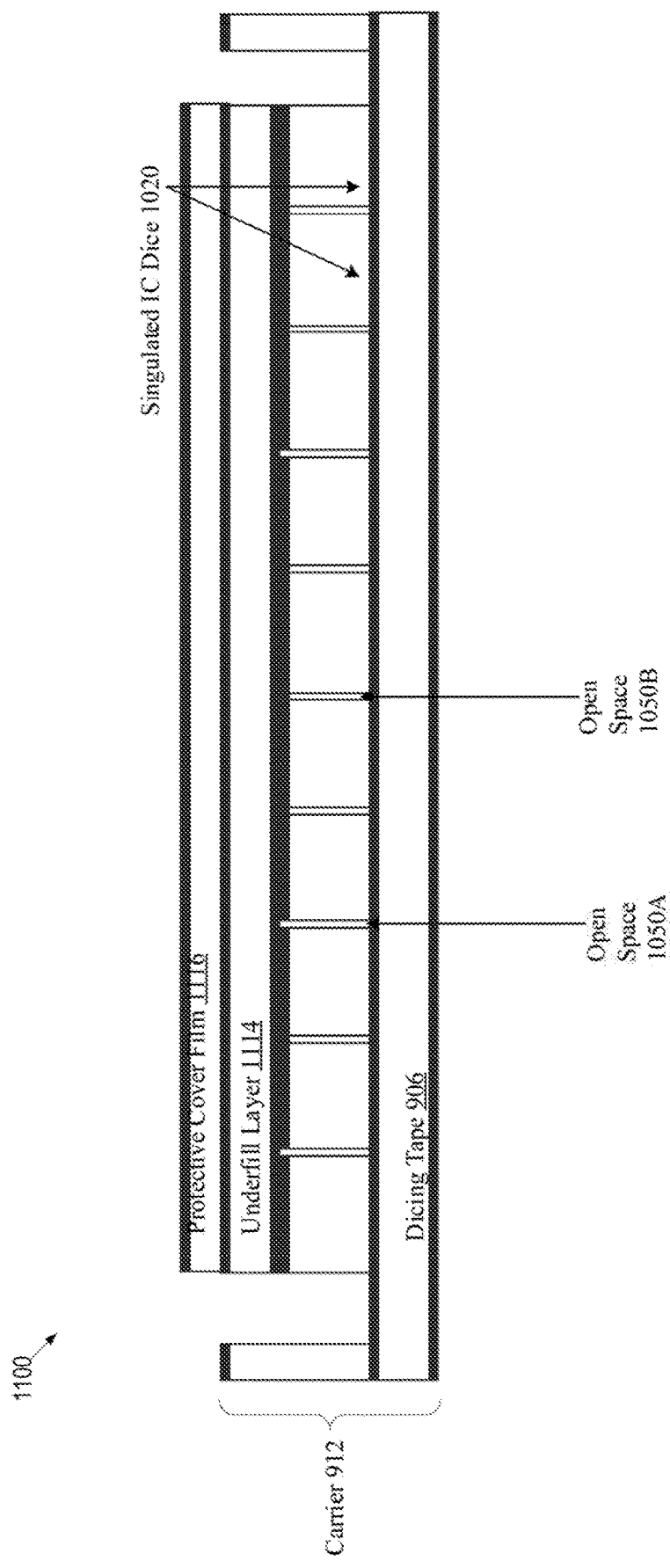
FIG. 11 illustrates singulated IC dice of a device wafer used in a fabrication process including third operations for forming an underfill layer and a protective cover film above the singulated IC dice, in accordance with some embodiments of the disclosure.

FIG. 11 illustrates singulated IC dice of a device wafer used in a fabrication process including third operations for forming an underfill layer and a protective cover film above the singulated IC dice, in accordance with some embodiments of the disclosure.

Diagram 1100 of FIG. 11 illustrates singulated IC dice 1020 and underfill layer 1114 and protective cover film 1116 disposed above the singulated IC dice 1020. In some embodiments, the singulated IC dice 1020 are provided on dicing tape 906 of the carrier 912. The singulated IC dice 1020 are position on the dicing tape 906 to provide open space (e.g., streets) between sides of adjacent singulated IC dice 1020.

In some embodiments, the underfill layer 1114 and protective cover film 1116 are disposed above the singulated IC dice 1020 and the open space between the adjacent singulated IC dice 1020. The protective cover film 1116 is positioned above the underfill layer 1114. It can be noted that disposition of the underfill layer 1114 and protective cover film 1116 is further described above, and in particular with respect to FIG. 2. In some embodiments, one or more of the underfill layer 1114 or protective cover film 1116 includes one or more photodefinable materials (also referred to as "photosensitive material(s)" herein). Photodefinable can refer to a characteristic of a material where an exposure to light (e.g., a particular range or a particular wavelength) can cause the material to be modified (e.g., change in the material properties such as harden or soften the material). A photodefinable material can be patterned by exposing the material to a pattern of light. The hardened photodefinable material can remain while the unhardened (or degraded) photodefinable material can be removed, which results in a particular pattern of photodefinable material.

In some embodiments, the photodefinable material can include positive acting photodefinable material. With positive acting photodefinable material, light is directed to the photodefinable material in the areas that are intended to be remove. When the positive acting photodefinable material is exposed to the light, the chemical structure of the material changes and becomes more soluble in the photo developer. These exposed areas of the photodefinable material can be washed away with the photo developer solvent, leaving the underlying material. The areas of the photodefinable material that are not exposed to the light are left insoluble to the photo developer. A copy of the desired pattern can be applied to the positive acting photodefinable material.

In some embodiments, the photodefinable material can include negative acting photodefinable material. With negative acting photodefinable material, exposure to light can cause the chemical structure of the photodefinable material to polymerize, which has the opposite effect of positive acting photodefinable materials. Instead of becoming more soluble, negative acting photodefinable materials can become difficult to dissolve. As a result, the light exposed negative acting photodefinable material can remain while the photoresist developer solution works to remove the areas that are unexposed to the light. An inverse pattern of desired features can be applied to the negative acting photodefinable material.

Figure 12:
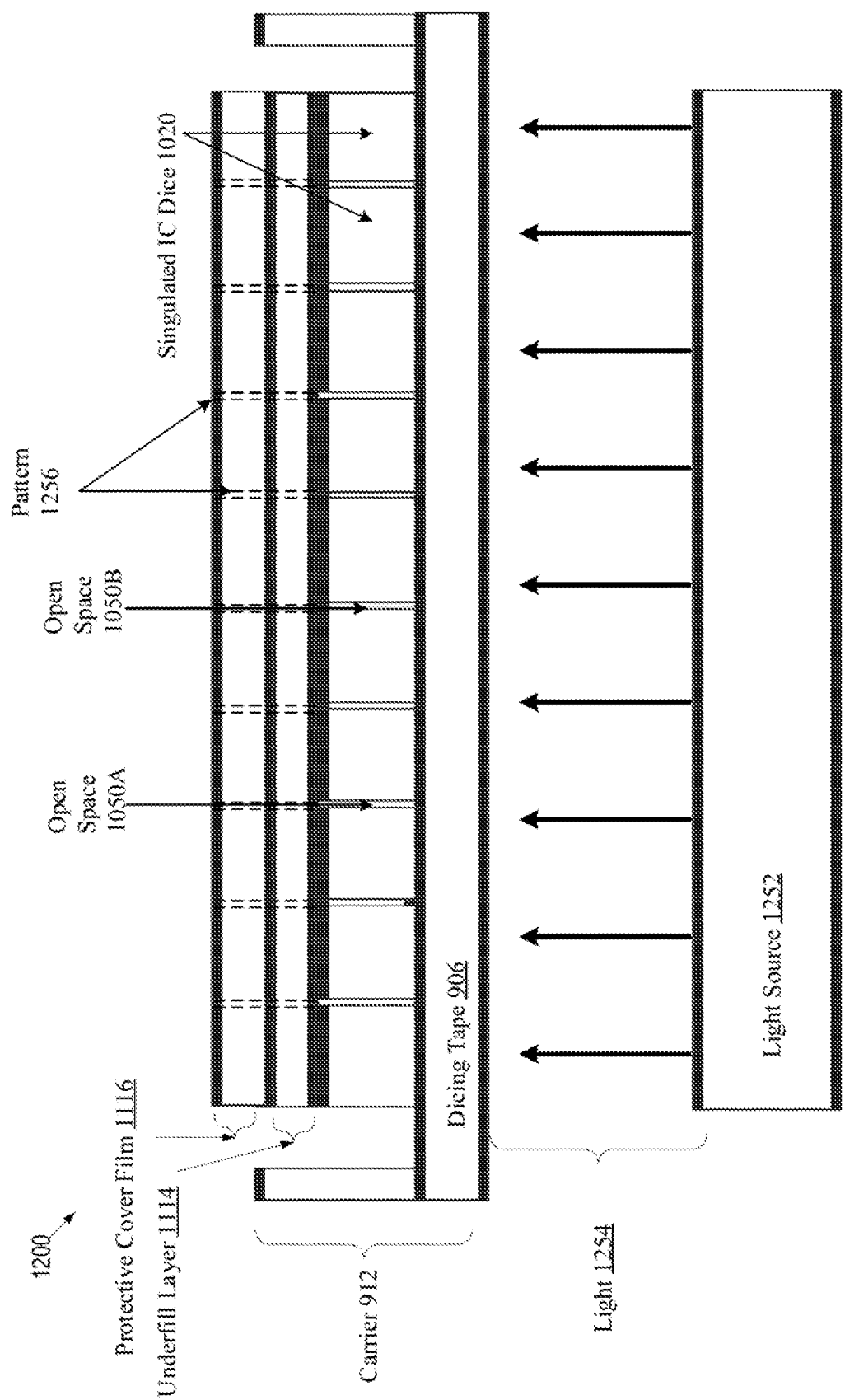
FIG. 12 illustrates singulated IC dice of a device wafer used in a fabrication process including fourth operations for performing an exposure operation to produce a pattern on one or more of the underfill layer or protective cover film, in accordance with some embodiments of the disclosure.

FIG. 12 illustrates singulated IC dice of a device wafer used in a fabrication process including fourth operations for performing an exposure operation to produce a pattern on one or more of the underfill layer or protective cover film, in accordance with some embodiments of the disclosure.

Diagram 1200 of FIG. 12 illustrates a performance of an exposure operation to produce a pattern 1256 on one or more of the underfill layer 1114 or protective cover film 1116. A pattern can refer to a design created on a material where some areas of the material have a change in the material properties of the material based on exposure of those areas to light (e.g., cured material), and other areas of the material do not have a change in the characteristics of the material based an absence of the exposure to light. An exposure operation can refer to the application of one or more wavelength(s) of light (or range(s) of wavelengths of light) to a photodefinable material. The exposure operation can create a pattern in or on the photodefinable material based on the light exposure. In addition to the wavelength of light, in an exposure operation one or more of the duration of the exposure of light or power of the exposure of light can be controlled.

In some embodiments and as illustrated, a light source 1252 projects light 1254 through the underside of the dicing tape 906 and through the open space to areas of the underfill layer 1114 and the protective cover film 1116 to form a pattern 1256. The pattern 1256 is represented to the dashed lines thought areas of the underfill layer 1114 and protective cover film 1116 (e.g., above the streets) to show that the underfill layer 1114 and protective cover film 1116 at those areas have been modified due to the exposure of light 1254 through the streets between the singulated IC dice 1020. It can be noted that the streets of the singulated IC dice 1020 can function as a "virtual" mask in the exposure operation. In some embodiments where the light 1254 is projected up through the streets, the one or more photodefinable materials included in underfill layer 1114 and protective cover film 1116 are positive acting photodefinable materials. In some embodiments where the light 1254 is projected up through the streets, the underfill layer 1114 is transparent or partially transparent to the wavelength(s) of light used in the exposure operation.

In some embodiments and as illustrated in FIG. 12, both the underfill layer 1114 and protective cover film 1116 include one or more photodefinable materials such that a pattern can be formed on the underfill layer 1114 and protective cover film 1116 using an exposure operation. In other embodiments, one or more of underfill layer 1114 or protective cover film 1116 does not include a photodefinable material. For example, the underfill layer 1114 can include one or more photodefinable materials and the protective cover film 1116 does not include photodefinable materials.

In some embodiments, to perform the exposure operation to produce the pattern on one or more of the underfill layer 1114 or protective cover film 1116, light is projected through a top surface of the protective cover film 1116 to the underfill layer 1114 to form the pattern. For example, a mask (or maskless) exposure operation can project light from above the protective cover film 1116 to form the pattern. In such embodiments, the one or more photodefinable materials of the underfill layer 1114 or protective cover film 1116 can include either positive acting or negative acting photodefinable materials. In some embodiments where the light is projected from above the protective cover film 1116 at least the protective cover film 1116 is transparent or partially transparent to the wavelength of light used in the exposure operation.

Figure 13:
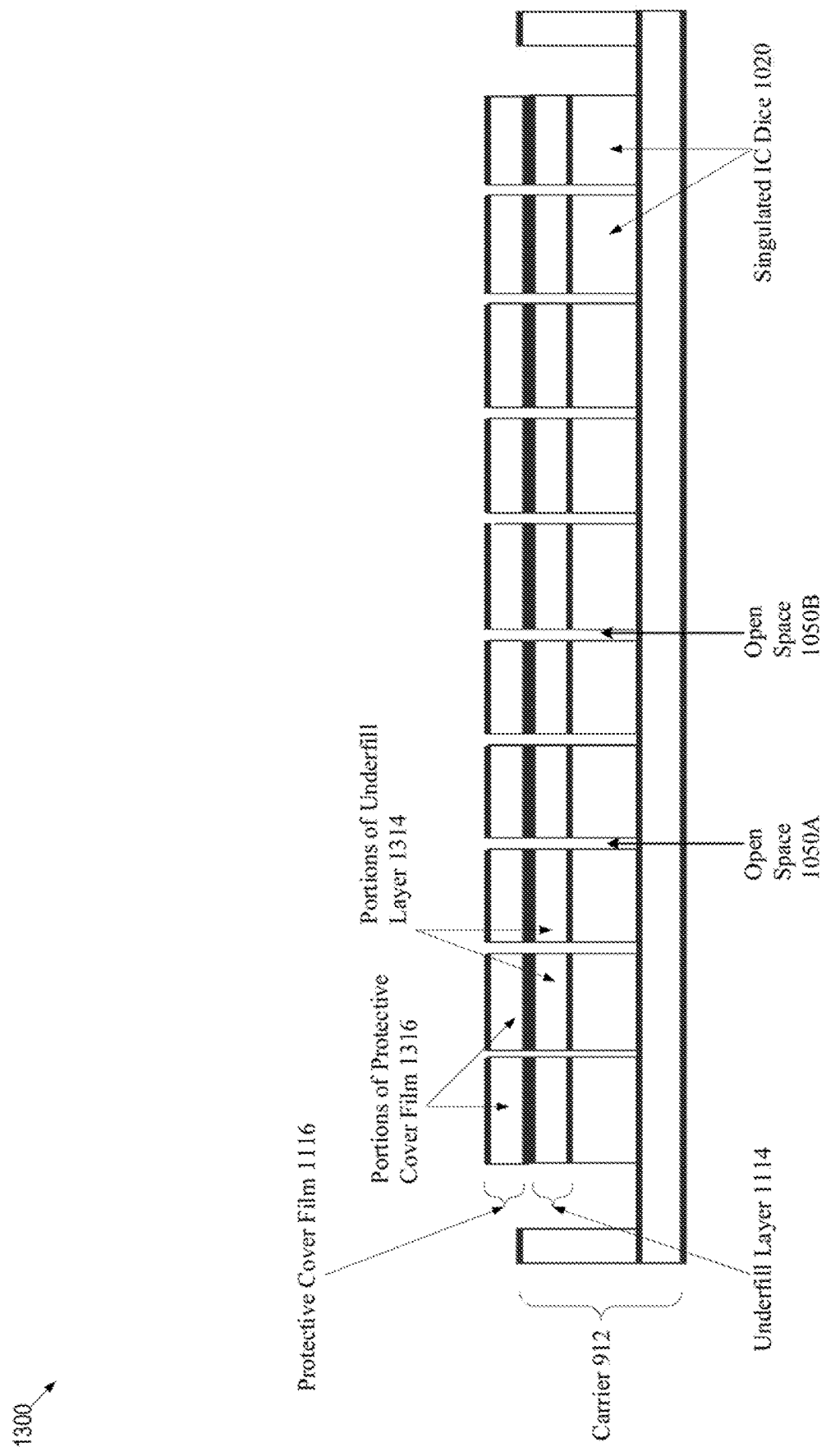
FIG. 13 illustrates singulated IC dice of a device wafer used in a fabrication process including fifth operations for removing the underfill layer and protective cover film at areas above the open space between the sides of the adjacent singulated IC dice, in accordance with some embodiments of the disclosure.

FIG. 13 illustrates singulated IC dice of a device wafer used in a fabrication process including fifth operations for removing the underfill layer and protective cover film at areas above the open space between the sides of the adjacent singulated IC dice, in accordance with some embodiments of the disclosure.

Diagram 1300 of FIG. 13 illustrates removing, based on the pattern, the underfill layer 1114 and protective cover film 1116 at areas above the open space between the sides of the adjacent singulated IC dice 1020 to create portions of protective cover film 1316 and portions of underfill layer 1314.

In some embodiments to remove the underfill layer 1114 and protective cover film 1116 at areas above the open space, a developing operation can be performed. A developing operation can include exposing the underfill layer 1114 and protective cover film 1116 to a developing solution (e.g., chemical removal) to remove the underfill layer 1114 and protective cover film 1116 at the areas above the open space (e.g., which have been patterned). For example, the solvent can include one or more of acetone or tetramethylammonium hydroxide (TMAH). In some embodiments, the developing operation also includes a cleaning operation to clean loose particles generated from the removal of the underfill layer 1114 and protective cover film 1116 at areas above the open space. For example, isopropyl alcohol (IPA) can be used to clean the loose particles.

FIG. 14A illustrates singulated IC dice of a device wafer used in a fabrication process including sixth operations for removing one or more portions of the protective cover film, in accordance with some embodiments of the disclosure.

Diagram 1400 of FIG. 14A is similar to diagram 500 of FIG. 5A and the description with respect to FIG. 5A is not repeated in its entirety here for the sake of brevity. In some embodiments, one or more portions of protective cover film 1316 are removed from the singulated IC dice 1020. In some embodiments, a detaping operation removes all the portions of protective cover film 1316, as illustrated. Subsequent to removing all the portions of protective cover film 1316, the singulated IC dice 1020 can be removed from carrier 912 and used in subsequent operations, such as die stacking as described with respect to FIG. 6.

FIG. 14B illustrates singulated IC dice of a device wafer used in a fabrication process including seventh operations for removing one or more portions of the protective cover film, in accordance with some embodiments of the disclosure.

Diagram 1450 of FIG. 14B shows the selective removal of portions of protective cover film 1316. Diagram 1450 of FIG. 14B is similar to diagram 550 of FIG. 5B and the description with respect to FIG. 5B is not repeated in its entirety here for the sake of brevity.

In some embodiments, one or more singulated dice on the carrier 912 can have respective portions of the protective cover film removed (e.g., selective detaping operation), while other singulated IC dice on the carrier 912 do not have respective portions of the protective cover film removed. In some embodiments, a first portion of the protective cover film above a first singulated die can be removed. The first singulated die can be removed from the carrier 912. Subsequent to removing the first singulated IC die from the carrier 912, a second portion of the protective cover film above a second IC die is removed. In some embodiments, subsequent to removing the first singulated IC die, the first singulated IC die is stacked above another IC die, as described with respect to FIG. 6.

In some embodiments, the portion of the protective cover film of a first singulated IC die of the singulated IC dice 1020 can be removed. The underfill layer of the first singulated IC die can remain. The carrier 912 can include an open area where a second singulated IC die had been previously removed, where the second singulated die was removed prior to removing the protective cover film of the first singulated IC die. A third singulated IC die can also be orientated above the carrier 912. The protective cover film and the underfill layer above the third singulated IC die remains (e.g., when the first or second singulated IC dice are removed from the carrier 912) and protects the third singulated IC die and its portion of underfill layer from the contaminants.

Elements of FIGS. 1-6 and FIGS. 9-14B may be described below to help illustrate method 1500 of FIG. 15. Method 1500 may be performed as one or more operations. It may be noted that method 1500 may be performed in any order and may include the same, different, more, or fewer operations. It may be noted that method 1500 may be performed by one or more pieces of semiconductor fabrication equipment or fabrication tools, herein after referred to as fabrication equipment.

Figure 15:
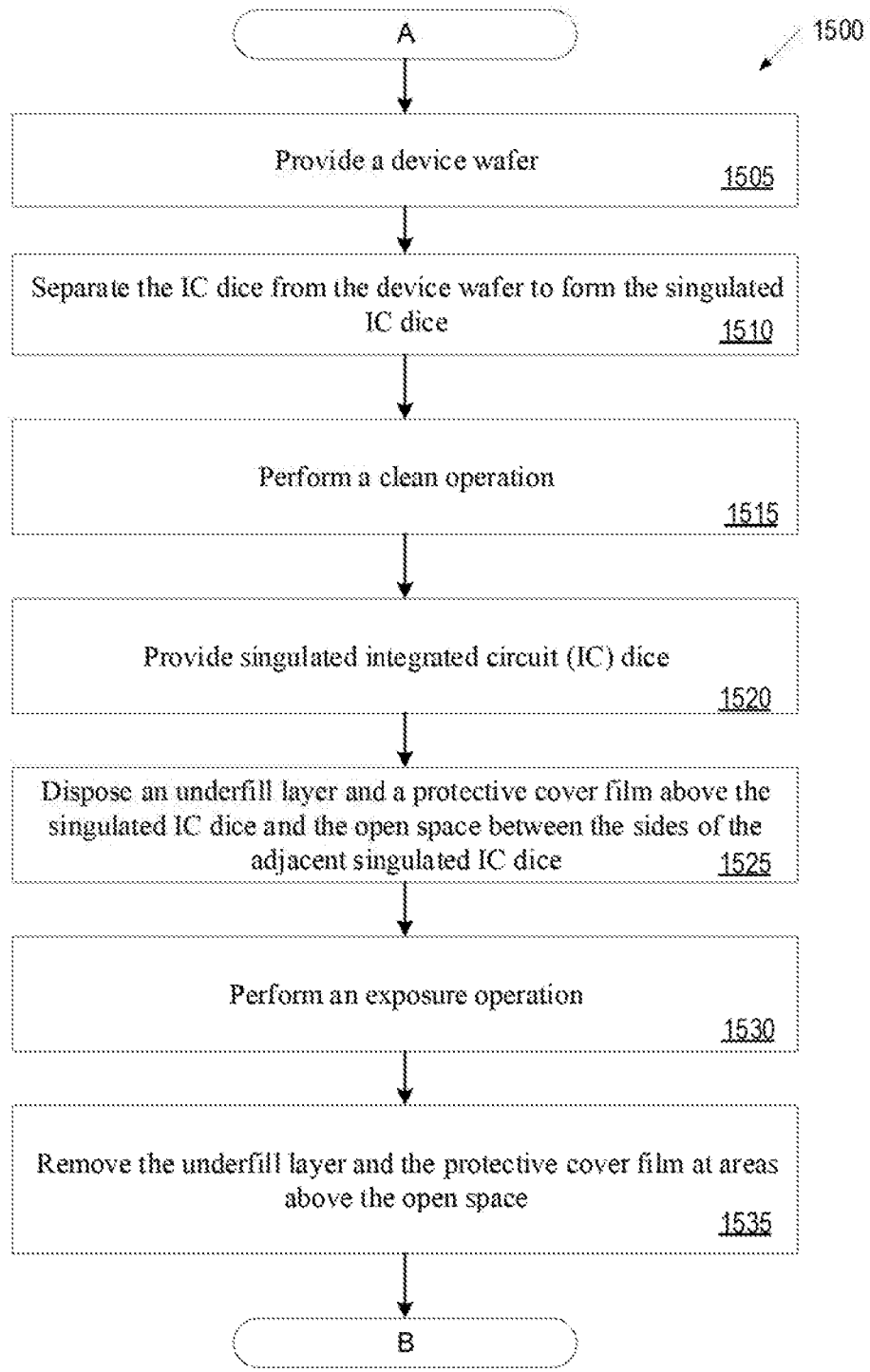
FIG. 15 illustrates a flow diagram of a fabrication process for using a protective cover film and underfill layer over singulated IC dice, in accordance with some embodiments of the disclosure.

FIG. 15 illustrates a flow diagram of a fabrication process for using a protective cover film and underfill layer over singulated IC dice, in accordance with some embodiments of the disclosure.

At operation 1505 of method 1500, fabrication equipment provides a device wafer. The device wafer can include multiple IC dice that are undiced. In some embodiments, the device wafer can be provided on dicing tape of a carrier.

At operation 1510, fabrication equipment separates the IC dice from the device wafer to form singulated IC dice. In some embodiments, the singulated IC dice are positioned on the dicing tape to provide open space between sides of adjacent singulated IC dice.

At operation 1515, fabrication equipment performs a clean operation. A clean operation can remove loose particles associated with separating the IC dice from the device wafer.

At operation 1520, the singulated IC dice are provided. In some embodiments, the singulated IC dice are provided on the dicing tape of the carrier. As noted above, the singulated IC dice are positioned on the dicing tape to provide open space between the sides of the adjacent singulated IC dice.

At operation 1525, fabrication equipment disposes an underfill layer and a protective cover film above the singulated IC dice and the open space between the sides of the adjacent singulated IC dice. The protective cover film is positioned above the underfill layer. In some embodiments, the underfill layer and the protective cover film include one or more photodefinable materials.

In some embodiments, fabrication equipment disposes the underfill layer and the underfill layer separately. For example, fabrication equipment disposes an underfill layer above the singulated IC dice and the open space between the sides of the adjacent singulated IC dice. The underfill layer includes one or more photodefinable materials. Fabrication equipment then disposes a protective cover film above the underfill layer.

At operation 1530, fabrication equipment performs an exposure operation. The exposure operation can produce a pattern on one or more of the underfill layer or the protective cover film.

In some embodiments, to perform the exposure operation to produce the pattern on the underfill layer and the protective cover film, fabrication equipment projects light through an underside of the dicing tape and through the open space to the areas of the underfill layer and the protective cover film above the open space to form the pattern.

In some embodiments, to perform the exposure operation to produce the pattern on the underfill layer and the protective cover film, fabrication equipment projects light through a top surface of the protective cover film to the underfill layer to form the pattern.

In some embodiments, the exposure operation is performed to produce a pattern on the underfill layer. The protective cover film may or may not have photodefinable materials and may or may not be patterned using the exposure operation.

At operation 1535, fabrication equipment removes the underfill layer and protective cover film at areas above the open space. In some embodiments, fabrication equipment removes, based on the pattern, the underfill layer and the protective cover film at areas above the open space between the sides of the adjacent singulated IC dice to create portions of the underfill layer and portions of the protective cover film that are disposed above the singulated IC dice.

In some embodiments, fabrication equipment removes one or more portions of the protective cover film from the singulated IC dice. In some embodiments, the removal of the one or more portions of the protective cover film exposes respective one or more portions of the underfill layer above the singulated IC dice.

In some embodiments, removing the one or more portions of the protective cover film from the singulated IC dice includes removing the portions the protective cover film using a detaping operation that removes all of the portions of the protective cover.

In some embodiments, removing the one or more portions of the protective cover film from the singulated IC dice includes removing a first portion of the protective cover film above a first singulated IC die. The first singulated IC die is removed from a carrier. The singulated IC dice are orientated above the carrier. Subsequent to removing the first singulated IC die from the carrier, a second portion of the protective cover film above a second singulated IC die is removed.

In some embodiments, fabrication equipment removes, from the carrier, a singulated IC die having a respective portion of the protective cover film removed. In some embodiments, fabrication equipment stacks the singulated die above another IC die or a different object, such as a substrate (e.g., flip chip).

In some embodiments, fabrication equipment removes, based on the pattern, the underfill layer at areas above the open space between the sides of the adjacent singulated IC dice to create portions of the underfill layer that are disposed above the singulated IC dice. The protective cover film at the areas may or may not be removed. The protective cover film may or not include photodefinable material(s), and may or may not be singulated in to portions of protective cover film. In some instances, the protective cover film can be singulated into portions other than using photodefinable material(s) (e.g., laser, saw, among others). In some embodiments, the protective cover film is removed prior to removing the underfill layer at the areas above the open spaces.

In some embodiments, a method includes providing singulated integrated circuit (IC) dice on dicing tape of a carrier, wherein the singulated IC dice are positioned on the dicing tape to provide open space between sides of adjacent singulated IC dice; disposing an underfill layer above the singulated IC dice and the open space between the sides of the adjacent singulated IC dice, wherein the underfill layer includes one or more photodefinable materials; disposing a protective cover film above the underfill layer; performing an exposure operation to produce a pattern on the underfill layer; and removing, based on the pattern, the underfill layer at areas above the open space between the sides of the adjacent singulated IC dice to create portions of the underfill layer that are disposed above the singulated IC dice.

In some embodiments, the method further includes providing a device wafer on the dicing tape of the carrier, wherein the device wafer includes IC dice; and separating the IC dice from the device wafer to form the singulated IC dice. In some embodiments, the method, wherein performing the exposure operation to produce the pattern on the underfill layer includes projecting light through an underside of the dicing tape and the open space to the areas of the underfill layer to form the pattern.

Figure 16:
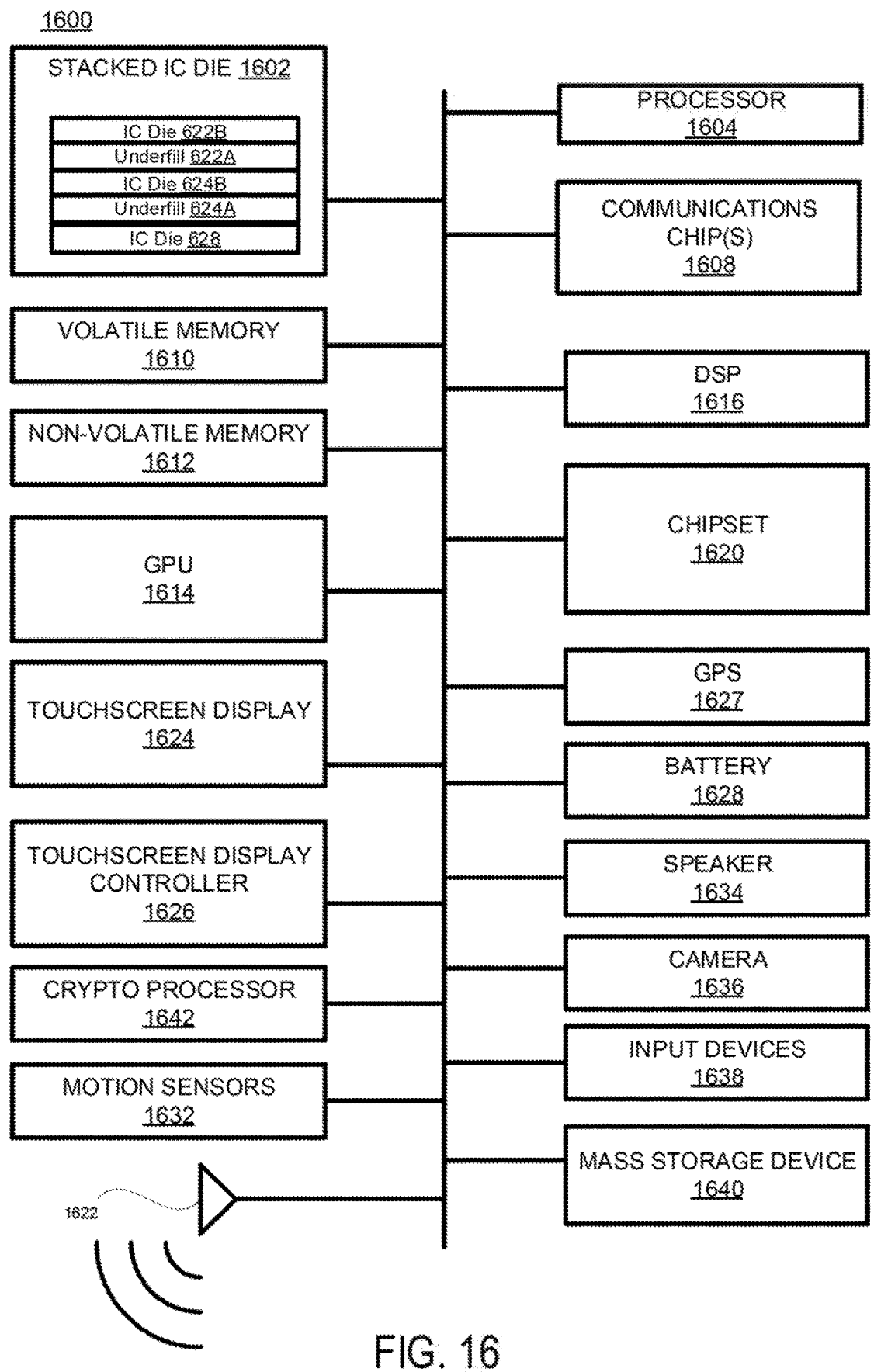
FIG. 16 is a computing device fabricated in accordance with embodiments of the disclosure.

FIG. 16 is a computing device fabricated in accordance with embodiments of the disclosure. The computing device 1600 may include a number of components. In one embodiment, the components are attached to one or more circuit boards, such as a motherboard. In an alternate embodiment, some or all of these components are fabricated onto a single system-on-a-chip (SoC) die, such as a SoC used for mobile devices. In embodiments, the components in the computing device 1600 include, but are not limited to, a stacked IC die 1602 and at least one communications logic unit 1608. In some embodiments, the communications logic unit 1608 is fabricated in a separate integrated circuit chip that may be bonded to a substrate or motherboard that is shared with or electrically coupled to the stacked IC die 1602. The stacked IC die 1602 may include IC die 622B, underfill 622A, IC die 624B, underfill layer 624A, and IC die 628, for example. It may be noted that in embodiments stacked IC die 1602 may include additional elements (e.g., additional IC die on the stacked die, a processor, etc.). In another example, stacked IC die 1602 may include some or all the elements described herein, as well as include additional elements.

Computing device 1600 may include other components that may or may not be physically and electrically coupled to the motherboard or fabricated within a SoC die. These other components include, but are not limited to, volatile memory 1610 (e.g., DRAM), non-volatile memory 1612 (e.g., ROM or flash memory), a graphics processing unit 1614 (GPU), a digital signal processor 1616, a crypto processor 1642 (e.g., a specialized processor that executes cryptographic algorithms within hardware), a chipset 1620, at least one antenna 1622 (in some embodiments two or more antenna may be used), a display or a touchscreen display 1624 (e.g., that may include stacked IC die 602), a touchscreen controller 1626, a battery 1628 or other power source, a power amplifier (not shown), a voltage regulator (not shown), a global positioning system (GPS) device 1627, a compass (not shown), a motion coprocessor or sensors 1632 (that may include an accelerometer, a gyroscope, and a compass), a microphone (not shown), a speaker 1634, a camera 1636, user input devices 1638 (such as a keyboard, mouse, stylus, and touchpad), and a mass storage device 1640 (such as hard disk drive, compact disk (CD), digital versatile disk (DVD), and so forth). The computing device 1600 may incorporate further transmission, telecommunication, or radio functionality not already described herein. In some embodiments, the computing device 1600 includes a radio that is used to communicate over a distance by modulating and radiating electromagnetic waves in air or space. In further embodiments, the computing device 1600 includes a transmitter and a receiver (or a transceiver) that is used to communicate over a distance by modulating and radiating electromagnetic waves in air or space.

The communications logic unit 1608 enables wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 1600 may include a multitude of communications logic units 1608. For instance, a first communications logic unit 1608 may be dedicated to shorter range wireless communications such as Wi-Fi, NFC, and Bluetooth and a second communications logic unit 1608 may be dedicated to longer range wireless communications such as GPS, EDGE, GPRS, CDMA, WiMAX, LTE, Ev-DO, and others.

The processor 1604 (also referred to "processing device" herein) may refer to any device or portion of a device that processes electronic data from registers and/or memory to transform that electronic data into other electronic data that may be stored in registers and/or memory. Processor 1604 represents one or more general-purpose processing devices such as a microprocessor, a central processing unit, or the like. More particularly, the processor 1604 may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 1604 may also be one or more special-purpose processing devices such as an application specific integrated circuit (ASIC), a field programmable gate array (FPGA), a digital signal processor (DSP), network processor, or the like.

In various embodiments, the computing device 1600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further embodiments, the computing device 1600 may be any other electronic device that processes data.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms or operations presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an embodiment" or "one embodiment" or "an implementation" or "one implementation" or the like throughout may or may not mean the same embodiment or implementation. One or more embodiments or implementations described herein may be combined in a particular embodiment or implementation. The terms "first," "second," "third," "fourth," etc. as used herein are meant as labels to distinguish among different elements and may not necessarily have an ordinal meaning according to their numerical designation.

The terms "over," "above" "under," "between," and "on" as used herein refer to a relative position of one material layer or component with respect to other layers or components. For example, one layer disposed above or over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   providing singulated integrated circuit (IC) dice on dicing tape of a carrier, wherein each singulated IC die of the singulated IC dice is fully separated from one another, and wherein the singulated IC dice are positioned on the dicing tape to provide open space between sides of adjacent singulated IC dice;
   disposing an underfill layer and a protective cover film above the singulated IC dice and the open space between the sides of the adjacent singulated IC dice, wherein the protective cover film is positioned above the underfill layer, wherein the underfill layer and the protective cover film comprise one or more photodefinable materials;

performing an exposure operation to produce a pattern on the underfill layer and the protective cover film; and removing, based on the pattern, the underfill layer and the protective cover film at areas above the open space between the sides of the adjacent singulated IC dice to create portions of the underfill layer and portions of the protective cover film that are disposed above the singulated IC dice.

2. The method of claim 1, further comprising:
providing a device wafer on the dicing tape of the carrier, wherein the device wafer comprises IC dice; and
separating the IC dice from the device wafer to form the singulated IC dice.

3. The method of claim 2, further comprising:
performing a clean operation to remove loose particles associated with the separating the IC dice from the device wafer.

4. The method of claim 1, wherein performing the exposure operation to produce the pattern on the underfill layer and the protective cover film comprises:
projecting light through an underside of the dicing tape and the open space to the areas of the underfill layer and the protective cover film to form the pattern.

5. The method of claim 1, wherein performing the exposure operation to produce the pattern on the underfill layer and the protective cover film comprises:
projecting light through a top surface of the protective cover film to the underfill layer to form the pattern.

6. The method of claim 1, further comprising:
removing one or more portions of the protective cover film from the singulated IC dice, wherein the removal of the one or more portions of the protective cover film exposes respective one or more portions of the underfill layer above the singulated IC dice.

7. The method of claim 6, wherein removing the one or more portions of the protective cover film from the singulated IC dice comprises:
performing a detaping operation that removes all of the portions of the protective cover film.

8. The method of claim 6, wherein removing the one or more portions of the protective cover film from the singulated IC dice comprises:
removing a first portion of the protective cover film above a first singulated IC die;
removing the first singulated IC die from the carrier; and
subsequent to removing the first singulated IC die from the carrier, removing a second portion of the protective cover film above a second singulated IC die.

9. The method of claim 8, further comprising:
subsequent to removing the first singulated IC die, stacking the first singulated IC die above another IC die.

\* \* \* \* \*